(12) United States Patent
Hisamoto et al.

(10) Patent No.: US 6,873,009 B2
(45) Date of Patent: Mar. 29, 2005

(54) VERTICAL SEMICONDUCTOR DEVICE WITH TUNNEL INSULATOR IN CURRENT PATH CONTROLLED BY GATE ELECTRODE

(75) Inventors: Dai Hisamoto, Kodaira (JP); Kozo Katayama, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/459,621

(22) Filed: Jun. 12, 2003

(65) Prior Publication Data

US 2003/0209739 A1 Nov. 13, 2003

Related U.S. Application Data

(63) Continuation of application No. 09/569,298, filed on May 11, 2000, now abandoned.

(30) Foreign Application Priority Data

May 13, 1999 (JP) .......................................... 11-132332

(51) Int. Cl.[7] .............................................. H01L 29/78
(52) U.S. Cl. ...................................... 257/329; 257/316
(58) Field of Search .................. 257/60, 302, 328–334; 438/156, 206, 209, 212, 268

(56) References Cited

U.S. PATENT DOCUMENTS

| | | | |
|---|---|---|---|
| 5,340,754 A | | 8/1994 | Witek |
| 5,527,723 A | * | 6/1996 | Witek et al. ................ 438/212 |
| 5,627,390 A | * | 5/1997 | Maeda et al. ............... 257/302 |
| 6,465,834 B1 | * | 10/2002 | Nakazato et al. ........... 257/314 |

FOREIGN PATENT DOCUMENTS

| | | |
|---|---|---|
| JP | 61-67953 | 4/1986 |
| JP | 10-200001 | 7/1998 |

OTHER PUBLICATIONS

J. Tucker et al, "Silicon field–effect transistor based on quantum tunneling," Appl. Phys. Lett. 65(5), Aug. 1, 1994, pp. 618–620.

C. Wang et al, "Sub–50–nm PtSi Schottky source/drain MOSFETs," Part of the SPIE Conference on Microelectronic Device Technology II, SPIE vol. 3506, pp 230–233.

S. Shukuri et al, "A Complementary Gain Cell Technology for Sub–1V Supply DRAMs," IEDM 92, pp. 1006–1008.

J. Willey & Sons, "Physics of Semiconductor Devices," Second Edition, pp. 540–553.

Terauchi et al, A Surrounding Gate Transistor (SGT) Gain Cell for Ultra Hig Density DRAMS, VLSI Technology, 1993. Digest Technical Papers. 1993 Symposium on 1993, pp. 21–22.

* cited by examiner

*Primary Examiner*—Long Pham
*Assistant Examiner*—Marcos D. Pizarro-Crespo
(74) *Attorney, Agent, or Firm*—Mattingly, Stanger, Malur & Brundidge, P.C.

(57) ABSTRACT

It is an object of the present invention to provides a field effect transistor with extremely low leakage current. It is another object of the invention to provide a semiconductor memory device having an excellent information holding characteristic. It is a further object of the invention to provide a method for manufacturing in a simple manner a novel field effect transistor or semiconductor memory device with extremely low leakage current. According to a typical basic configuration of the present invention, a thin insulating film is inserted in a vertically disposed Schottky junction to form source and drain electrodes and a tunnel of the insulating film in the junction is controlled by a gate electrode. The gate electrode is disposed on each of both sides of a vertical channel, permitting a field effect to be exerted effectively on the junction, whereby a junction leakage in an OFF state can be made extremely low.

15 Claims, 29 Drawing Sheets

VERTICAL SEMICONDUCTOR DEVICE WITH TUNNEL INSULATOR IN CURRENT PATH CONTROLLED BY GATE ELECTRODE

This is a continuation application of U.S. Ser. No. 09/569,298, filed May 11, 2000 now abandoned.

BACKGROUND OF THE INVENTION

1. Field of the Invention

The present invention relates to a semiconductor device capable of being integrated on a large scale and a semiconductor memory device using the semiconductor device. The present invention is further concerned with a manufacturing method for the semiconductor device or the semiconductor memory device.

2. Related Arts

A principal portion of a ULSI transistor using a silicon substrate, which is a typical up-to-date integrated semiconductor device, has such a sectional structure as shown in FIG. 1. In the same figure, the transistor used in a CMOS is constituted by an insulated gate transistor which uses diffusion layers (200, 300) heavily doped with impurity as source and drain electrode regions on a semiconductor substrate 100. The reference numeral 500 denotes a gate electrode.

A MOSFET, which is a typical example of an insulated gate transistor, uses only a different conductive type carrier as a carrier in a channel to be controlled with respect to a substrate which serves as the channel. For this reason, the insulated gate transistor is called a unipolar device. In the unipolar device it is the basis in device operation that such electrodes as source and drain are electrically isolated from the substrate 100. According to the prior art, diffusion layers and a substrate use different conductive types to form a PN junction, and electrodes and the substrate are electrically isolated from each other by a built-in barrier of the junction. However, as the source-drain distance becomes shorter, with only the barrier it is no longer possible to effect the isolation to a satisfactory extent, and the problem of leakage to the substrate and that of generation of leakage current between source and drain have become serious problems. This current leakage is presumed to be generated because the influence of a drain electric field extends to the source side. For suppressing the current leakage it is effective to diminish (shallow) the depth of the impurity diffusion layers 200 and 300 to make smaller an area where the source faces the drain, which depth is shown as Xj in FIG. 1. However, shallowing the depth of the diffusion layers gives rise to the problem that the resistance of the diffusion layers increases to deteriorate the driving force of the transistor. As a different approach it has been proposed to surround the diffusion layer electrodes with an insulating film, thereby providing an anti-leakage barrier between the electrodes and the channel (substrate). According to the structure disclosed in Japanese Patent Laid-Open No. Hei 10-200001, a multi-insulating film is inserted not only between diffusion layer electrodes and a channel but also in the channel portion. But the latter structure, in view of its manufacturing process, can be regarded as a structure called TFT (Thin Film Transistor) in which the channel portion is constituted not by a single crystal but by a polycrystal. In this structure, it is possible to suppress the leakage current without increasing the diffusion layer resistance, but it is necessary to let a channel current flow through an insulating film, thus giving rise to the problem that the driving force is deteriorated.

As a method for preventing the increase in electrode resistance caused by shallow junction it has been proposed to use a metallic material for the formation of source and drain regions. The transistor in question is generally called a Schottky barrier source-drain MOSFET (SB-MOSFET) because the electrode-substrate isolation is made not by PN junction but by Schottky junction formed in the metal-semiconductor contact portion. For example, a study is made about this structure by Tucker, et al. in Appl. Phys. Lett. 65(5), pp. 618 to 620, 1994. As to an actual trial manufacture of this transistor, reports have been made, for example, by Wang, et al. in Part of the SPIE Conference on Microelectronic Device Technology II, SPIE vol. 3506, pp. 230 to 233 in July, 1998. These reports have revealed that the leakage between junctions can be suppressed effectively even in a short channel structure with a reduced source-drain distance, as an effect obtained by using Schottky junction. However, it is difficult to form a sufficient junction in comparison with PN junction, with consequent increase in the leakage to the substrate and cancellation of the source-drain leakage reducing effect. Besides, since the ON-state resistance of junction is high, the electrode resistance reducing effect is not exhibited.

As to a gain cell for use in a semiconductor memory device, an example which uses a p-type MOS for write and an n-type MOS for read is shown in Shoji Shukuri, et al., IEDM 92, 1006–1008.

SUMMARY OF THE INVENTION

It is the first object of the present invention to provide an insulated gate field effect transistor in which the leakage current is extremely low. More particularly, the present invention intends to suppress the lowering of driving force caused by the adoption of various measures for diminishing leakage current which increases with channel shortening.

It is the second object of the present invention to provide a semiconductor memory device superior in memory characteristic. A three-terminal switching device with reduced leakage current can be obtained by using the foregoing insulated gate field effect transistor which is low in the leakage current. This point is effective particularly in forming a semiconductor memory device.

It is another object of the present invention to provide a method for manufacturing the above semiconductor device or semiconductor memory device.

Reference will first be made to the main point of the inventive concept of the present invention for making the invention easier to understand. More detailed modes of embodiment of the present invention will be given later.

In Schottky junction there is formed an interface of different substances which sandwich the junction therebetween, resulting in that the leakage current in the junction is more conspicuous than in PN junction. In the case where an SB-MOSFET is formed on the basis of the conventional structure shown in FIG. 1, it is only the gate-end junction that is used for switching, and most of the junction area is occupied by the bottom despite the bottom being unnecessary in switching operation. Thus, the bottom is a main source of current leakage. For suppressing the unnecessary leakage, as shown schematically in FIG. 2, an effective countermeasure is to sandwich the channel 101 from both sides between gates 500 and 510, thereby eliminating unnecessary junction and allowing junction to be present only in the channel direction. As to a more concrete structure, it will be described later in detail in the description of embodiments of the invention on the basis of the manufacturing method. In this structure, junction is provided at only gate ends necessary for switching, with no fear of leakage caused by unnecessary junction.

Further, according to the structure in question, to suppress the leakage, an insulating layer as a barrier against leakage is sandwiched between the metal and the semiconductor. This is the application of the structure wherein diffusion layer electrodes are surrounded with an insulating film.

FIG. 3 is a band structure diagram for explaining an ordinary Schottky junction. In FIG. 3 there are shown a junction region of a metal portion 350 and a semiconductor portion 110, an upper end of a valence band, a lower end of a conduction band, and Fermi level Ef. FIG. 4 is a band structure diagram for explaining a junction used in the present invention. The structure shown in FIG. 4 includes an isolator layer 931 in addition to the structure shown in FIG. 3.

More specifically, in the Schottky junction, leakage current is suppressed by a barrier Pm called Schottky barrier, as shown in the band diagram of FIG. 3. If an insulating film having a larger barrier height Pi than Pm is inserted between the metal portion 350 and the semiconductor portion 110 as in FIG. 4, it is possible to decrease the number of carriers passing through from the metal side to the semiconductor side. The junction of this insulating layer-inserted structure as a substitute for Schottky junction is known as MIS junction (Metal Insulation Junction). An example of this junction is described, for example, on pages 540 to 553 of Physics of Semiconductor Devices, second edition, JOHN WILEY & SONS written by Sze. Even in the presence of such an insulating layer having a large barrier height Pi, it is possible to promote the tunneling effect by making the insulating layer extremely thin, thus permitting a switching operation of the junction.

Generally, carriers which pass through the insulating film under the tunnel effect rely on the barrier height, film thickness, and carrier energy. When viewed from the device structure, it is possible to control the barrier height between the metallic material and the insulating film, the thickness of the insulating film, and a potential distribution in a non-equilibrium condition.

According to the structure of the present invention there is adopted a vertical channel configuration to form a device having a large channel length without increasing the plane area, whereby it is possible to suppress the increase of leakage current caused by channel shortening. Further, by disposing gates on both sides, it becomes possible to utilize the field effect more effectively. The adoption of such a vertical structure permits easy formation of an asymmetric type transistor which has heretofore been difficult. Consequently, a barrier using an insulating film can be formed on only one side, whereby the lowering of driving force can be suppressed.

By making the most of the above effects it is possible to obtain a three-terminal transistor structure which can keep the leakage current extremely low. Such a low leakage characteristic is effective in forming a semiconductor device superior in information storing, writing and reading operations. This point will be described later by way of embodiments.

DESCRIPTION OF THE INVENTION

Prior to a concrete description of embodiments of the present invention, main modes for carrying out the invention will be outlined below.

Semiconductor Device According to the Invention

A typical first mode of the present invention resides in a semiconductor device comprising a semiconductor region, the semiconductor region having a first conductive region, a first insulating film, a first semiconductor region, and a second conductive region; a second insulating film formed at least in the first semiconductor region; and a third conductive region formed on the surface of the second insulating film.

The present invention can provide a novel switching device, which is extremely useful as a switching portion in the novel semiconductor device as will be described later. The structure of the invention can be manufactured by a conventional manufacturing method adopted in the semiconductor field. Thus, the semiconductor device in question can be provided in an extremely inexpensive manner.

A typical second mode of the present invention resides in a semiconductor device comprising a stacked semiconductor region, the stacked semiconductor region having, in a stacked state, a first conductive region, a first insulating film, a first semiconductor region, and a second conductive region; a second insulating film formed on a side face of at least the first semiconductor region in which side face intersects the stacked direction of the stacked semiconductor region; and a third conductive region formed on the surface of the second insulating film.

Figure 4:
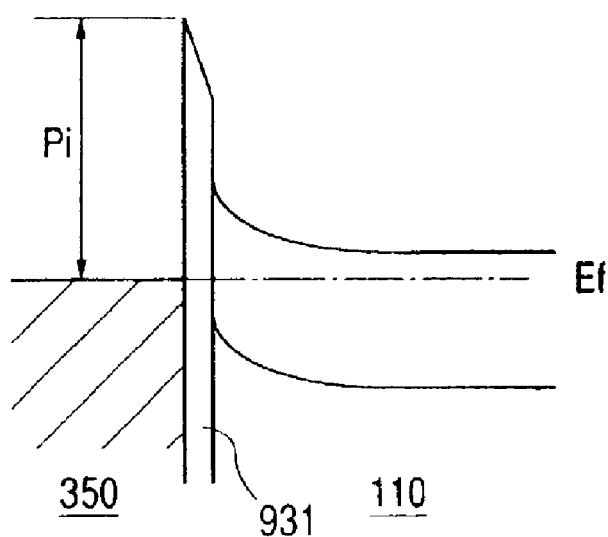
FIG. 4 is a band diagram explaining a junction used in the present invention.

In each of the above modes, the semiconductor region having the first conductive region, the first insulating film, and the first semiconductor region and the second conductive region, constitutes charge transfer means and a charge transfer region in an insulated gate field effect transistor. The first semiconductor region corresponds to a so-called channel region, and the first and second conductive regions correspond to either a source or a drain. Whether they are to be named source or drain merely depends on their operating condition. The semiconductor region comprising the first conductive region, the first insulating film, and the first semiconductor region is a stacked region having the band structure which has been described above with reference to FIG. 4. What is important in the above modes is the provision of the first insulating film.

As the material of the first insulating film there usually is employed an oxide, an oxide of a low oxidation degree, a nitride, or a nitride of a low degree of nitriding, of the metal used as the first conductive region, a silicon-metal oxide mixture, a silicon-metal nitride mixture, or an insulator which contains at least two of them. Suitable examples are oxides, nitrides, and silicides of heat-resisting metals. As examples of metals or conductors corresponding to metals are mentioned titanium, titanium silicide, tungsten, tungsten silicide, cobalt, cobalt silicide, platinum, platinum silicide, nickel, and nickel silicide. As typical examples of insulators are mentioned silicon oxides and silicon nitrides, as well as oxides and nitrides of various metals or heat-resisting metals. Titanium and titanium silicide are preferred examples because they are thermally stable. Silicon oxides or silicides are frequently used in conventional semiconductor manufacturing processes and are suitable for use in the manufacture of the semiconductor device and semiconductor memory device according to the present invention. Of course, the above-exemplified metals and insulators may be suitably combined where required.

The insulating film is formed to a thickness which permits the exhibition of the tunneling effect in the junction concerned. For example, the insulating film thickness is not larger than 3 nm, preferably in the range of 1 nm to 2 nm.

Although reference has been made above to concrete examples of the first conductive region and the first insulating film, it goes without saying that those examples are also applicable to various other modes and embodiments of the present invention described herein.

The present invention, in the third mode thereof, resides in a semiconductor device which is an insulated gate field effect transistor having a source, a drain, a gate electrode, and a channel region and which comprises a first insulating film on a first conductive region serving as a source or drain electrode, a semiconductor layer formed on the first insulating film and serving as a channel region, a second conductive region formed on the semiconductor layer and serving as a drain or source electrode, a second insulating film formed on a side face of the channel region, and a gate electrode, the gate electrode exerting a field effect on the channel region through the second insulating film.

The following various modes are conceivable depending on the selection of materials in various portions.

In the fourth mode of the present invention, the first conductive region in the above modes is formed of a metallic material.

In the fifth mode of the present invention, the first conductive region in the above modes is formed of a semiconductor material which is substantially metallized by heavily doping an impurity.

In the sixth mode of the present invention, the second conductive region is formed of a semiconductor material which is substantially metallized by heavily doping an impurity.

In the present invention, the above conductive regions may be used in combination. More specifically, the first and the second conductive region are used in combination, the first conductive region being formed of a metallic material or a semiconductor material which is metallized by heavily doping an impurity and the second conductive region being formed of a metallic material or a semiconductor material which is metallized by heavily doping an impurity.

In the eighth mode of the present invention, the first conductive region is formed of a semiconductor material which is metallized by heavily doping an impurity, and the second conductive region is formed of a metallic material or a semiconductor material which is metallized by heavily doping an impurity.

The amount of the impurity to be doped for the metallization of the semiconductor material as a matrix may be in the range usually adopted in the semiconductor field. For silicon, it is usually $10^{20}$ cm$^{-3}$ or more.

Needless to say, the above examples on the amount of dope are also applicable to various other modes and embodiments of the present invention described herein.

In the semiconductor device of the present invention, the semiconductor region sandwiched between the first and second conductive regions constitutes a charge transfer region, i.e., what is called a channel region. In this sense, therefore, the charge transfer region in the present invention is constituted by both semiconductor region and tunneling insulator. Thus, the following may be mentioned as an example of a mode indicative of this intention.

The present invention, in the ninth mode thereof, resides in a semiconductor device comprising a semiconductor region, the semiconductor region having a first conductive region, a first insulating film, a first semiconductor region, and a second conductive region; a second insulating film formed on a side face of the first semiconductor region in which side face intersects a stacked direction of the semiconductor region in the second semiconductor region; and a third conductive region formed on the surface of the second insulating film, wherein one of the first and second conductive regions is formed of a polycrystal silicon heavily doped with an impurity, the other is formed of a metal, and silicon and a tunneling insulator are disposed in a current path flowing from the first to the second conductive region.

It can be said that a more concrete form of the above mode is a semiconductor device wherein the source is formed by a polycrystal silicon heavily doped with an impurity, the drain is formed by a metal, and silicon and a tunneling insulator are disposed in a current path flowing from the source to the drain.

It can be said that a further practical form of the above modes of semiconductor devices according to the present invention is a semiconductor device wherein the carriers in the channel portion are depleted in an OFF state of switching in the semiconductor device.

Semiconductor Memory Device

Reference will now be made to a semiconductor memory device using any of the above semiconductor devices, i.e., insulated gate field effect transistors.

A typical tenth mode of the present invention resides in a semiconductor memory device which uses any of the above semiconductor devices according to the present invention as a write element and the first conductive region as a storage node portion and which has a read element connected electrically to the storage node portion.

In a more practical semiconductor memory device, the read element is a field effect transistor.

More preferably, in the semiconductor memory device of this mode, the storage node portion is surrounded with an insulating film, and information is stored by the electric charge held in the storage node portion.

In the case where the semiconductor memory device is constituted by using any of the various modes of the semiconductor devices according to the present invention as information write means, it is preferable that a conductive region formed in contact with the tunneling insulator in the semiconductor device be connected to a storage node side of the semiconductor memory device. The reason is that this is convenient for ensuring a stored charge. It goes without saying that no matter which of the first and second conductive regions in the semiconductor device may be formed on the storage node side of the semiconductor memory device, it is possible to provide the semiconductor memory device.

In case of constituting a semiconductor memory device by using any of the above various modes of semiconductor devices according to the present invention as information write means, it is more preferred that an N type insulated gate field effect transistor be disposed as a horizontal device and that a P type insulated gate field effect transistor be used as a vertical device using the tunnel insulator associated with the present invention.

A typical eleventh mode of the present invention resides in a semiconductor memory device comprising a first path for moving carriers, means for storing an electric charge which generates an electric field for changing the conductivity of the first path, and means for supplying a desired electric charge to the electric charge storing means in proportion to a desired voltage, wherein the means for supplying the desired electric charge to the electric charge storing means has a junction, the junction having a metallic electrode portion, a tunneling insulator, and a semiconductor region.

In other words, this mode is a semiconductor memory device having a source or drain electrode of a field effect transistor (T1) constituted by a semiconductor device according to the present invention and also having an insulated gate field effect transistor (T2) formed on the semiconductor substrate, wherein connection is made to a gate electrode of T2 through the channel of T1. A switching operation is performed by utilizing the tunneling insulator. The field effect transistor (T1) constituted by the semiconductor device according to the present invention has at least a stacked structure of conductive region—channel region—tunneling insulator—metallic conductive region. The conductive region or the metallic conductive region corresponds to the source or drain in the field effect transistor. Thus, there are the following modes of T1 and T2 connections:
(1) Conductive region—semiconductor region—tunneling insulator—metallic conductive region—T2 gate
(2) Metallic conductive region—tunneling insulator—semiconductor region—conductive region—T2 gate In an actual structure, it is more practical to form the metallic conductive region—T2 gate in the above (1) by the same layer or form the conductive region—T2 gate in the above (2) by the same layer, to serve both roles at a time.

The operation of the semiconductor device according to the present invention may be summarized such that in the semiconductor memory device of the above eleventh mode with information stored by an electric charge, the electric charge is taken in and out through the write element T1, and T2 is used as a read element for reading a storage condition of the electric charge.

The present invention, in the twelfth mode thereof, resides in a semiconductor device comprising a semiconductor region, the semiconductor region having a semiconductor substrate, a first impurity region and a second impurity region which are formed in opposition to the semiconductor substrate, a first insulating film which covers at least a first semiconductor region sandwiched between the first and second impurity regions, a first conductive region formed on the first insulating film, a second insulating film, a second semiconductor region, and a second conductive region; a third insulating film formed on a side face of the second semiconductor region in which side face intersects a stacked direction of the semiconductor region; and a third conductive region formed on the surface of the third insulating film.

In this mode of the invention, a channel region of a field effect transistor portion which constitutes a switching portion is formed in a direction intersecting or substantially orthogonal to the substrate of the semiconductor memory device. This configuration is what is called a vertical semiconductor device and is therefore advantageous to the reduction in size of the device. Further, if there is adopted a structure wherein a side wall of the second semiconductor region is covered with an insulating film, it is possible to provide a semiconductor memory device with reduced leakage current.

Other Main Modes of the Present Invention

The present invention, in the thirteenth mode thereof, resides in the semiconductor device referred to above in the tenth mode of the invention, wherein means for stabilizing the potential is disposed between a gate electrode wiring of the write element and the substrate potential. More particularly, it is required that a relative potential relation between the gate electrode and the conductive region be fixed even when power is off. A simplest and most practical example of the potential stabilizing means is a resistor. To meet this requirement there may be used many circuits.

The present invention, in the fourteenth mode thereof, resides in a semiconductor device which uses at least two semiconductor memory devices mentioned in the above eleventh or twelfth mode of the invention and wherein the read element T2 is electrically connected in series.

The present invention, in the fifteenth mode thereof, resides in any of the above semiconductor memory devices wherein at the time of reading information, the source or drain potential of T2 is changed without changing the gate electrode potential of the write element T1 to create a voltage shift between the gate electrode and the source and drain electrodes, thereby performing a read operation.

Since it is necessary that the gate potential be fixed as noted above, it is preferable in the semiconductor memory device in question that the source or drain potential be changed in a fixed state of the gate potential.

The present invention, in the sixteenth mode thereof, resides in any of the above semiconductor memory devices wherein at the time of reading information, the source or drain potential is changed without changing the gate electrode potential of the read element T2 to create a voltage shift between the gate electrode and the source and drain electrodes, thereby performing a read operation.

The present invention, in the seventeenth mode thereof, resides in a semiconductor memory device wherein a plurality of the semiconductor memory devices mentioned in the above eleventh or twelfth mode of the invention are arranged in the form of an array and wiring layers connected to the source and drain electrodes of the read elements T2 formed respectively on the substrates are arranged planarly so as to perpendicularly intersect each other.

The present invention, in the eighteenth mode thereof, resides in an integrated semiconductor device wherein any of the semiconductor devices or semiconductor memory devices relating to the present invention, e.g., the semiconductor device mentioned in the above first or second mode or the semiconductor memory device mentioned in the above tenth or eleventh mode is formed on an SOI (Silicon On Insulator) substrate. Since the insulating substrate is used, the semiconductor device or the semiconductor memory device functions more effectively for suppressing the leakage current.

The present invention, in the nineteenth mode thereof, resides in the above integrated semiconductor memory device, wherein means for stabilizing potential without consumption of electric power is disposed between a gate electrode wiring of the write element and the substrate potential.

The present invention, in the twentieth mode thereof, resides in a semiconductor memory device having write means using a field effect transistor and read means using a field effect transistor of a conductive type different from that of the write means.

The present invention, in the twenty-first mode thereof, resides, for example, in the semiconductor memory device mentioned in the above twentieth mode, wherein a potential for turning OFF a channel of the write element more securely than in the storage of an electric charge is applied to a gate electrode of the write element.

The present invention, in the twenty-second mode thereof, resides, for example, in the semiconductor memory device mentioned in the above twentieth mode, wherein potential information which is written has at least three values.

The present invention, in the twenty-third mode thereof, resides, for example, in the semiconductor memory device mentioned in the above twenty-first mode, wherein charge information which is held is read as a non-discreted potential.

The present invention, in the twenty-fourth mode thereof, resides, for example, in the semiconductor device mentioned in the above twelfth or twentieth mode, which has a function of performing an arithmetic operation with use of the electric charge which is held and the gate electrode potential.

Main Modes of the Invention Relating to Manufacturing Methods According to the Invention As to manufacturing methods according to the present invention, the first mode of the invention resides in a semiconductor device manufacturing method comprising the steps of forming a first insulating film on a semiconductor substrate, forming on the first insulating film a metallic layer or a semiconductor layer metallized by heavily doping an impurity, forming a second insulating film on the metallic layer or the metallized semiconductor layer, forming a semiconductor layer on the second insulating film, forming a third insulating film on a side face of the semiconductor layer, and forming on a side face of the third insulating film a metallic layer or a semiconductor layer metallized by heavily doping an impurity.

The second mode of a manufacturing method according to the present invention is a semiconductor device manufacturing method comprising the steps of forming a first insulating film on a semiconductor substrate, forming on the first insulating film a metallic layer or a semiconductor layer metallized by heavily doping an impurity, forming a second insulating film on the metallic layer or the metallized semiconductor layer, forming an amorphous semiconductor layer, forming a predetermined metallic layer on the amorphous semiconductor layer, and heating the metallic layer and allowing the amorphous semiconductor layer to be crystallized by the metal.

This semiconductor manufacturing method of the second mode is effective particularly for the manufacture of the foregoing vertical type transistor. Since the manufacturing method according to the present invention involves a process of stacking a semiconductor layer on a metallic or insulator layer, the method of this second mode is effective which can crystallize the semiconductor layer satisfactorily by heating after the formation of the same layer.

A typical example of the metal used in the semiconductor manufacturing method of the second mode is nickel (Ni). The thickness of the metallic layer also depends on the thickness of the amorphous semiconductor layer to be crystallized. An example of the thickness adopted frequently is in the range from approximately 2 nm to 15 nm or from 5 nm to 12 nm. A suitable heating temperature is selected in the range from approximately 500° C. to 700° C. A somewhat low temperature region of 500° C. to 560° C. is preferred in the actual manufacture. It suffices for the heating to be conducted in vacuum. The heating time also depends on the thickness of the semiconductor layer to be crystallized, but is approximately 20 hours.

A metallic layer, e.g., nickel layer, is formed on the amorphous semiconductor layer and nickel is allowed to shift to the semiconductor layer by heating. The amorphous semiconductor layer crystallizes in this nickel shifting process. This phenomenon itself is known as MILC (Metal Induced Lateral Crystallization).

Embodiments of the present invention will be described in detail hereinunder with reference to the accompanying drawings.

Figure 11:
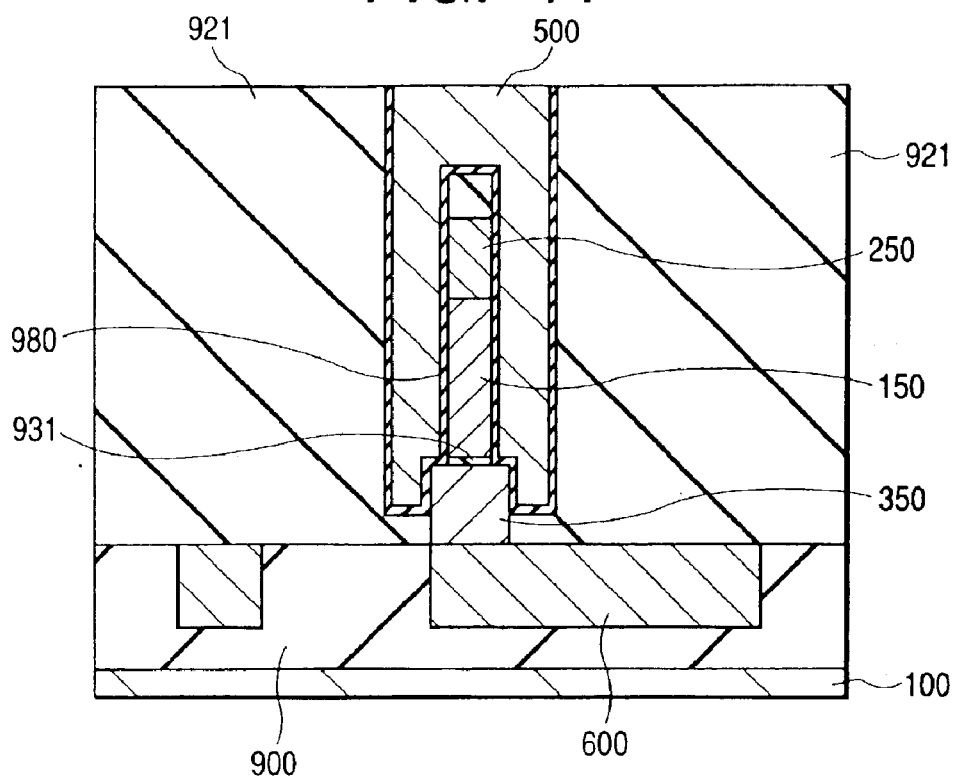
FIG. 11 is a sectional structure diagram explaining the device manufacturing process.
Figure 12:
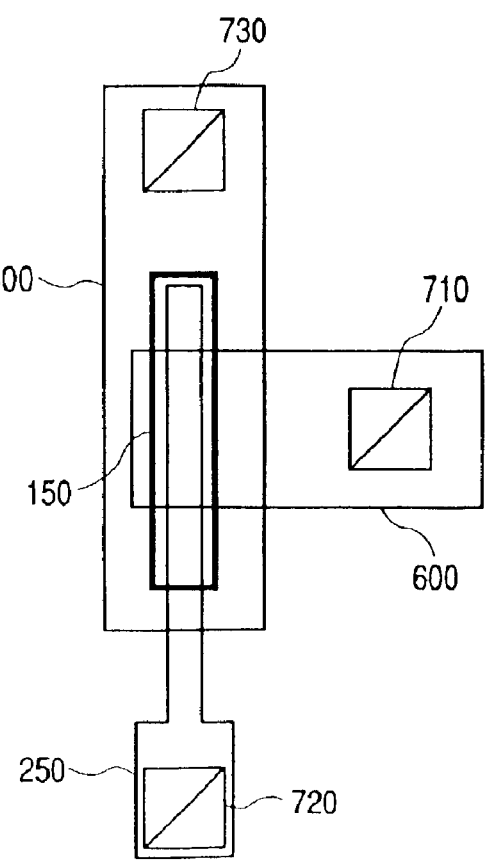
FIG. 12 is a plane layout diagram explaining a plane device layout.

FIG. 11 illustrates a sectional structure of a typical device according to the present invention and FIG. 12 illustrates a plane layout thereof. A wiring structure of this device and how to manufacture the device are the same as in the ordinary LSI, so the structure shown in FIG. 11 is in a completed state of formation of basic components of the device, with inter-device wiring layer omitted. In FIG. 11, the reference numerals 250 and 350 denote a source and a drain, respectively. A gate 500 exerts a field effect on a channel 150 from both sides through an insulating film 980. Carriers which pass (tunnel) through an insulating film 931 sandwiched between the drain 350 and the channel 150 are controlled by the gate 500. Numeral 600 denotes a buried wiring layer which is drawn out from the drain 350.

Figure 1:
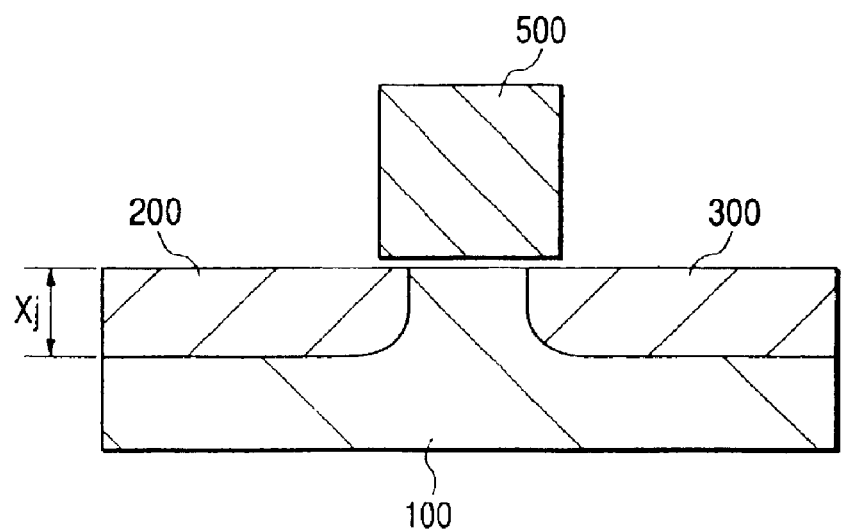
FIG. 1 is a sectional diagram of a typical conventional device structure.
Figure 2:
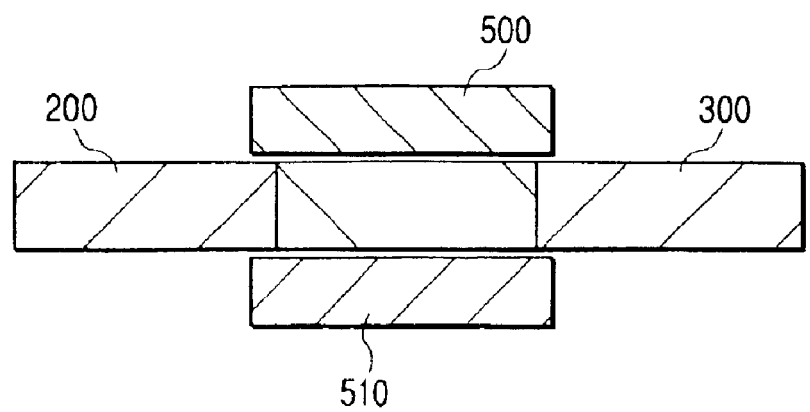
FIG. 2 is a sectional structure diagram showing another conventional device structure schematically.
Figure 3:
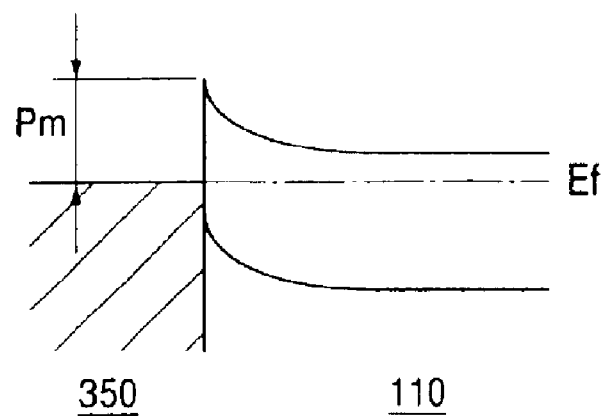
FIG. 3 is a band diagram explaining a conventional Schottky junction.

In this structure there does not exist any other unnecessary junction than the channel shown in FIG. 2; besides, the insulating film 931 is inserted in the channel-electrode junction, whereby the leakage current can be suppressed.

Now, with reference to FIGS. 5 to 11, a manufacturing process for the device will be described below.

Figure 5:
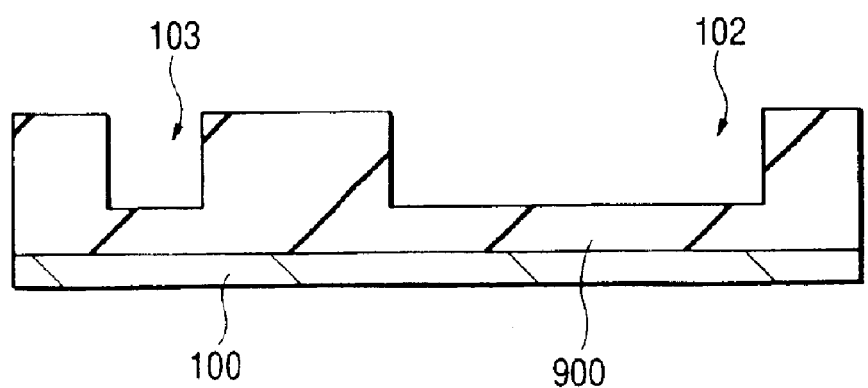
FIG. 5 is a sectional structure diagram explaining a device manufacturing process.

A thermal oxide film 900 having a thickness of 500 nm is formed on the surface of a silicon substrate 100. Then, a photoresist layer is formed on the thermal oxide film 900 and is subjected to patterning in a desired shape. The silicon substrate thus coated is subjected to an ordinary anisotropic dry etching to form trenches 102 and 103 which are, say, 300 nm in depth. (FIG. 5)

Figure 6:
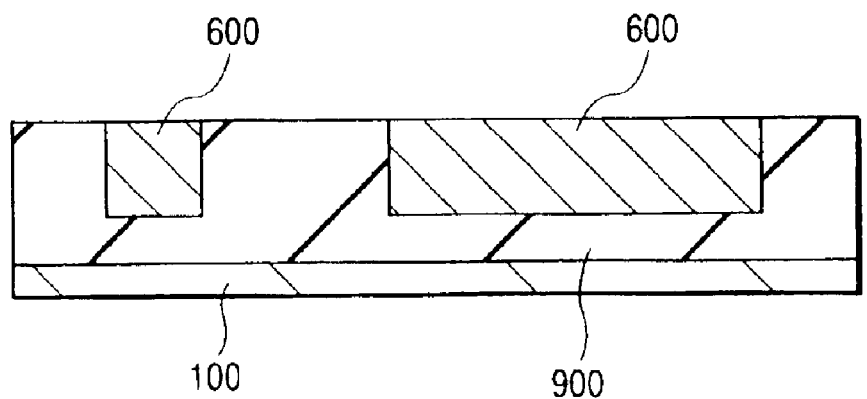
FIG. 6 is a sectional structure diagram explaining the device manufacturing process.

Tungsten is deposited on the surface of the substrate and the tungsten deposited on the other portion than the trenches 102 and 103 is removed by a CMP (Chemical Mechanical Polishing) method, which is known as a damascene method. As a result, there is obtained a structure with a tungsten 600 buried in the trenches 102 and 103. (FIG. 6)

Figure 7:
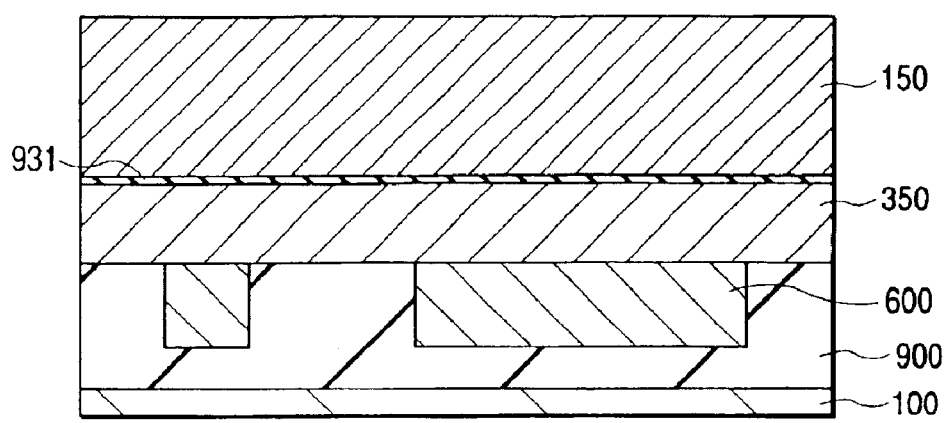
FIG. 7 is a sectional structure diagram explaining the device manufacturing process.

On the substrate are deposited titanium 100 nm (350), titanium oxide 5 nm (931), and polycrystal silicon 200 nm (150). The polycrystal silicon layer 150 serves as a channel layer. Subsequent single-crystallization permits a lowering in level of the grain boundary which causes the leakage current. This device structure does not go through a patterning process although the trenches described above with reference to FIG. 5 are formed. Further, a lower wiring layer formed by using the trenches is located below the channel portion 150, as shown in FIG. 11. Consequently, stacked layers may first be laminated together and then subjected to patterning, thus permitting realization of a channel using a single crystal. (FIG. 7)

After the above deposition of titanium oxide, a thin nickel film is deposited, on which is then deposited amorphous silicon, followed by heat treatment at a low temperature of 550° C., allowing nickel to shift through the silicon and thereby permitting crystallization of the polycrystal silicon layer 150. In this way there can be obtained a channel region having a high crystallinity. A suitable thickness of the thin nickel film is selected in the range of 2 nm to 10 nm, preferably 3 nm to 6 nm. After the above crystallization treatment, the nickel layer may be removed.

Using a photoresist, patterning is performed for the polycrystal silicon, titanium oxide, and titanium, allowing the surface of the oxide film 900 to be exposed except the trench portions.

Onto the substrate thus coated is then deposited an oxide film 920. The oxide film 920 is then subjected to etching by the CMP method to make the surface of the oxide film 920 flush with the surface of the polycrystal silicon layer 150. On the resulting plane surface is then formed a polycrystal layer 250 by heavily doping an impurity and is further deposited a silicon nitride film 950. In this case, by nitriding the surface of the polycrystal silicon layer 150 prior to formation of the heavily doped polycrystal layer 250 it is possible to form an extremely thin insulating film. With this thin insulating film, it is possible to suppress the diffusion of impurities from the exterior into the polycrystal silicon layer 150. This insulating film serves as a load against driving force of the channel, so can be deposited directly on the polycrystal silicon layer 150 if a sufficient channel length can be ensured for the required heat treatment. The above channel length corresponds to the thickness of the polycrystal silicon layer 150.

Figure 8:
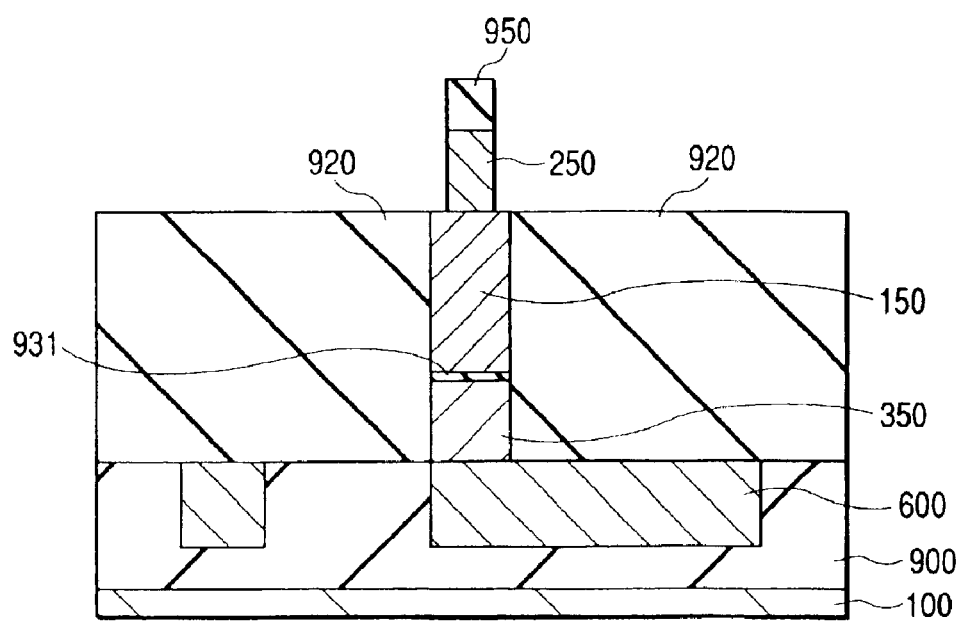
FIG. 8 is a sectional structure diagram explaining the device manufacturing process.

The electrode layer 250 may be formed by depositing a silicide film of, say, Pt or Er or a metal nitride film, e.g., TiN or WN film, as a heat-resisting barrier layer and by subsequently stacking a layer of a metallic material (e.g., tungsten). The nitride film or the metallic layer is then subjected to etching up to the surface of the oxide film 920. At this time, although not shown in the sectional structure, a contact (720) pad is formed as indicated at the reference numeral 250 in FIG. 12. (FIG. 8)

Figure 9:
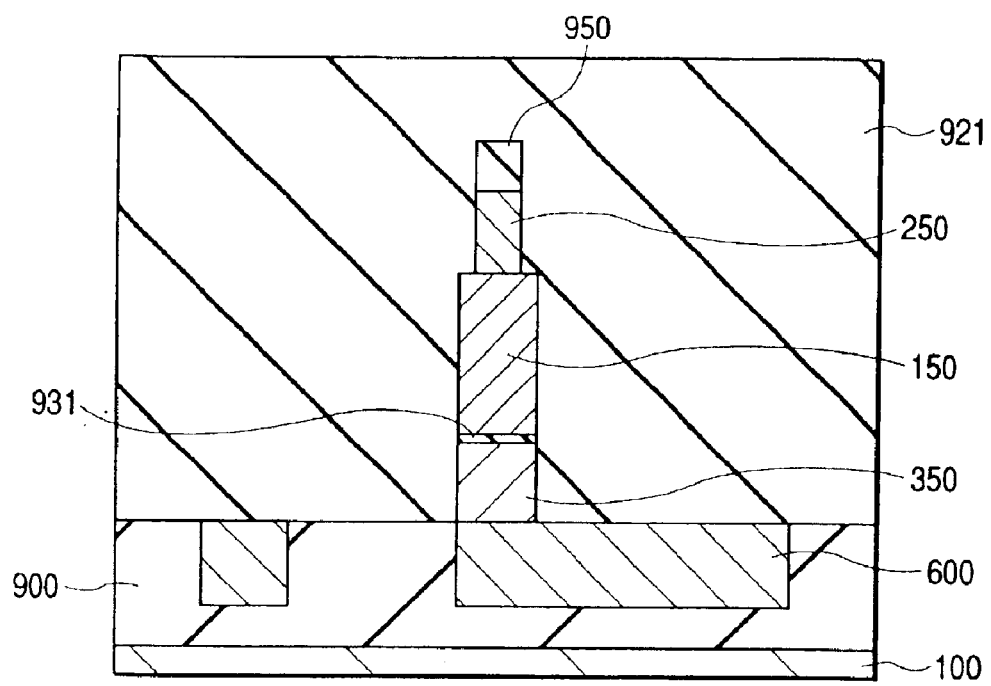
FIG. 9 is a sectional structure diagram explaining the device manufacturing process.

A silicon oxide film 921 is then deposited on the substrate and the surface thereof is planarized by the CMP method. The thus deposited and stacked oxide film serving as an inter-layer film will hereinafter be identified by the reference numeral 921. (FIG. 9)

Figure 10:
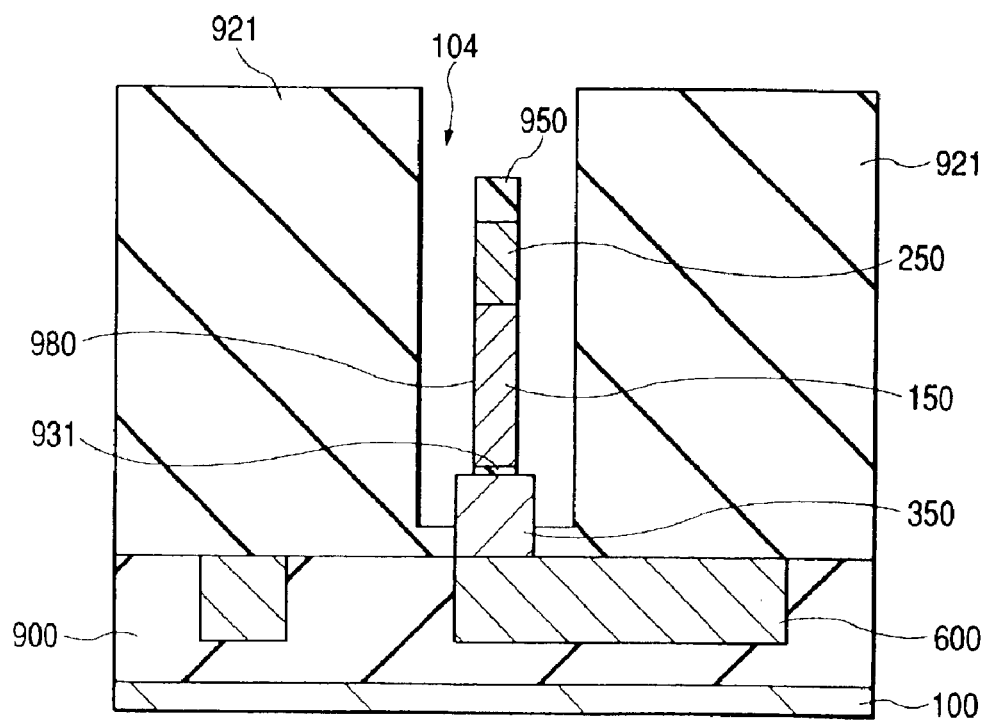
FIG. 10 is a sectional structure diagram explaining the device manufacturing process.

Further, a gate pattern using an ordinary photoresist is formed on the substrate. Then, a trench 104 is formed in the inter-layer insulating film 921 by an etching method using the said gate pattern, allowing side faces of the electrode layer 250 and the polycrystal silicon layer 150 as a channel to be exposed. (FIG. 10)

A silicon oxide film 980 is deposited 5 nm on the surface of the stacked layer present within the trench 104 by CVD technique, followed by formation of a gate 500 within the trench. As a gate insulating film there also may be used, for example, a silicon nitride film or a titanium oxide film. In FIG. 11, the silicon oxide film 980 is formed throughout the inner surface of the trench 104. The silicon oxide film is not always required to be formed on the whole surface of the trench 104. For example, it is not always necessary to form the silicon oxide film on the side walls of the inter-layer insulating film 921. In the example being considered, however, the oxide film is formed on the whole surface of the trench 104 because it is formed by CVD technique. This is also the case with other embodiments which will be described later. (FIG. 11)

Subsequently, wiring is formed in the same way as in the ordinary LSI manufacturing process.

FIG. 12 is a diagram showing a plane layout of a contact region for leading out from a principal portion of the semiconductor device. The area indicated at 500 represents a planar area corresponding to the gate. FIG. 12 shows a layout example of a contact 710 to the buried pad layer 600, a contact 730 to the gate 500, and a contact 720 to the electrode 250. In this structure, as shown in FIG. 11, since the barrier 931 is interposed between the electrode 350 and the channel 150, it is possible to suppress the leakage current strongly.

Where a heavily doped polycrystal silicon is used as the electrode 250, this electrode serves as a carrier supply source of the channel, it is possible to form N and P type devices according to conductive types based on impurities.

Although in the above embodiment the electrode 250 is formed after channel patterning for the formation of pad, the electrode may be formed simultaneously with the channel 150. This example will be described below with reference to FIGS. 13 to 17.

Figure 13:
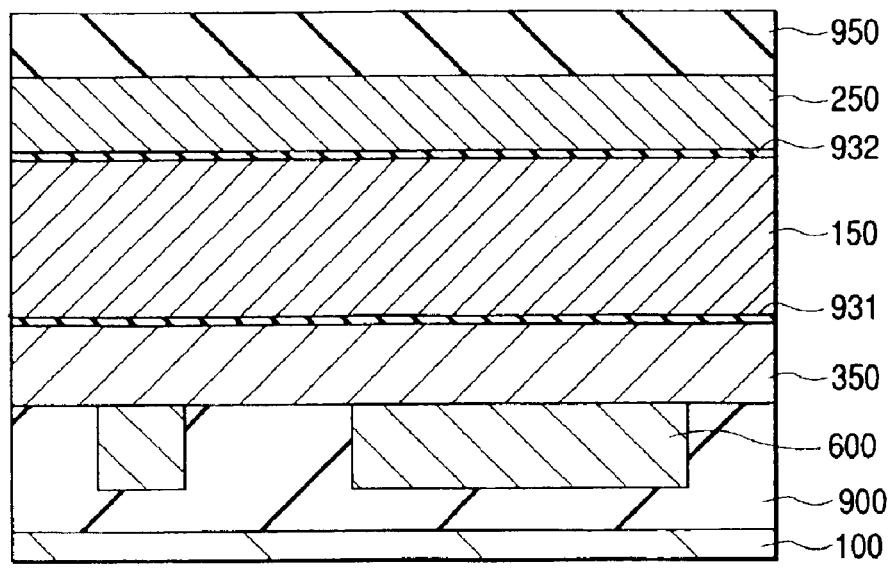
FIG. 13 is a sectional structure diagram explaining another device manufacturing process.

In this embodiment a semiconductor device is manufactured in the same way as in FIGS. 5 to 7 in the above embodiment. More specifically, a wiring 600, a titanium layer 350, a titanium oxide layer 931, and a polycrystal silicon layer 150 are formed on a predetermined substrate. Further deposited on the substrate are a titanium oxide layer 932, a titanium layer 250, and an insulating film 950. (FIG. 13)

Figure 14:
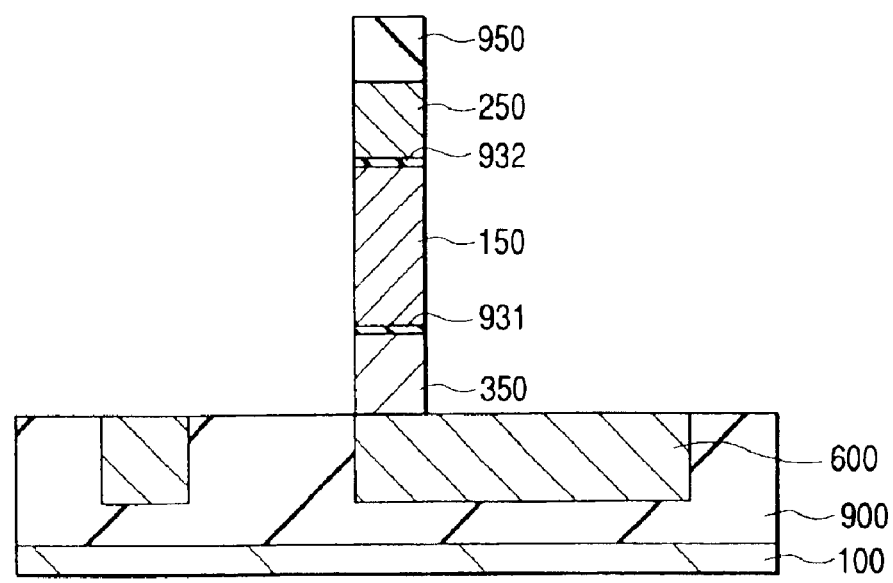
FIG. 14 is a sectional structure diagram explaining the another device manufacturing process.

A gate pattern using an ordinary photoresist is then formed on the substrate. The thus-stacked structure is then subjected to etching until the surface of an oxide film 900 is exposed by an etching method using the gate pattern. (FIG. 14)

Figure 15:
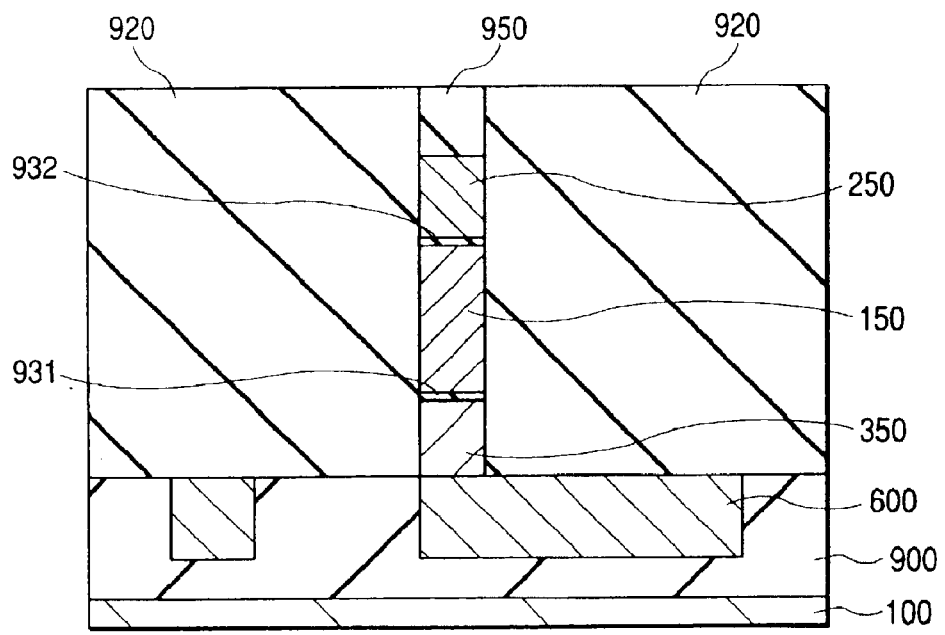
FIG. 15 is a sectional structure diagram explaining the another device manufacturing process.

Subsequently, an oxide film 920 is deposited on the substrate and is planarized by the CMP method, followed by etching back until exposure of the surface of the insulating film 950. (FIG. 15)

Figure 16:
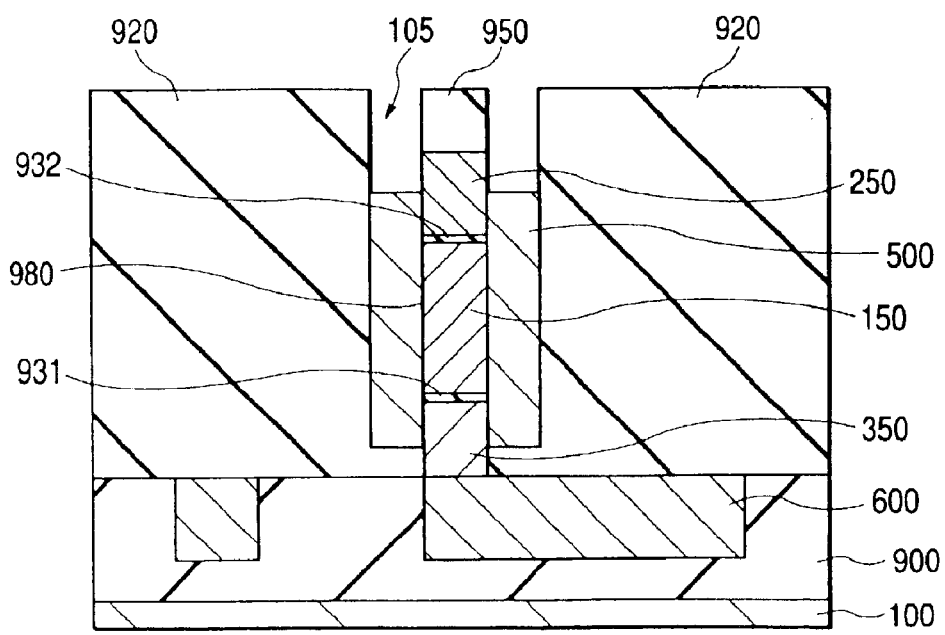
FIG. 16 is a sectional structure diagram explaining the another device manufacturing process.

Further, a gate pattern using a photoresist is formed on the substrate and a trench 105 is formed in the oxide film 920. A gate insulating film 980 is formed on side walls of the stacked structure located within the trench 105 thus formed. Then, a gate layer 500 is deposited in the trench 105 and is etched back to afford a structure wherein the gate layer 500 is buried up to side faces of the electrode layer 250. (FIG. 16)

Figure 17:
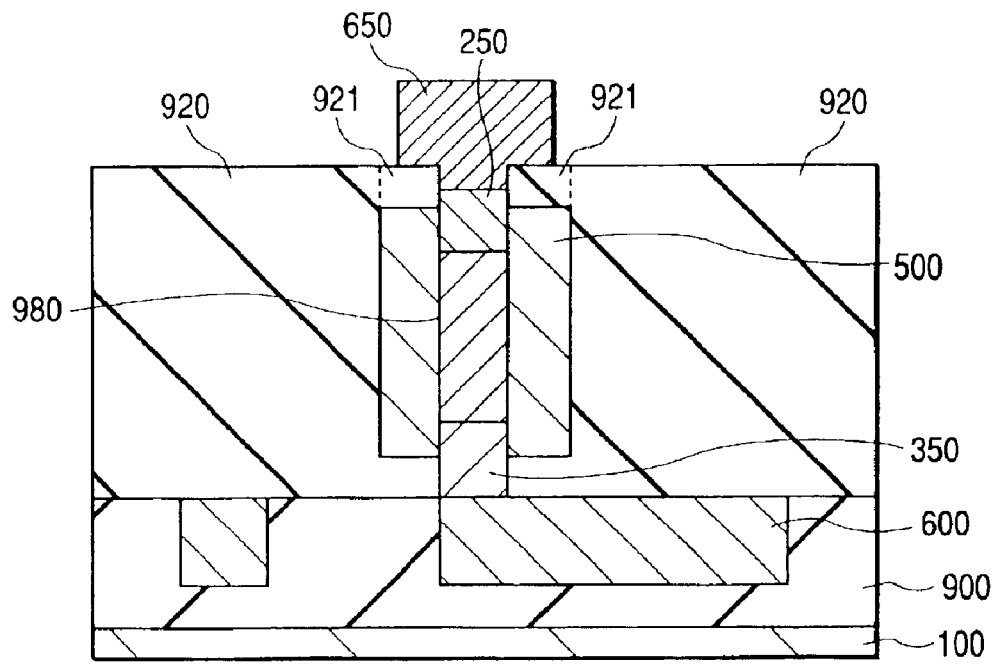
FIG. 17 is a sectional structure diagram explaining the another device manufacturing process.

The trench on the gate layer 500 is filled up with an insulating film 921, followed by surface planarization, allowing the insulating film 950 to be exposed. After removal of the insulating film 950, a metallic layer 650 is formed to form a wiring for the electrode layer 250. This process is the same as the conventional contact hole and metal wiring forming process. In this way both contact formation and wiring formation for the gate layer 500 and the buried layer 600 can be done at a time. (FIG. 17)

For demonstrating how this device is effective when used in an integrated circuit, an example of forming an OR circuit and an AND circuit (or a NAND circuit) as typical operational gates will be given below.

Figure 18:
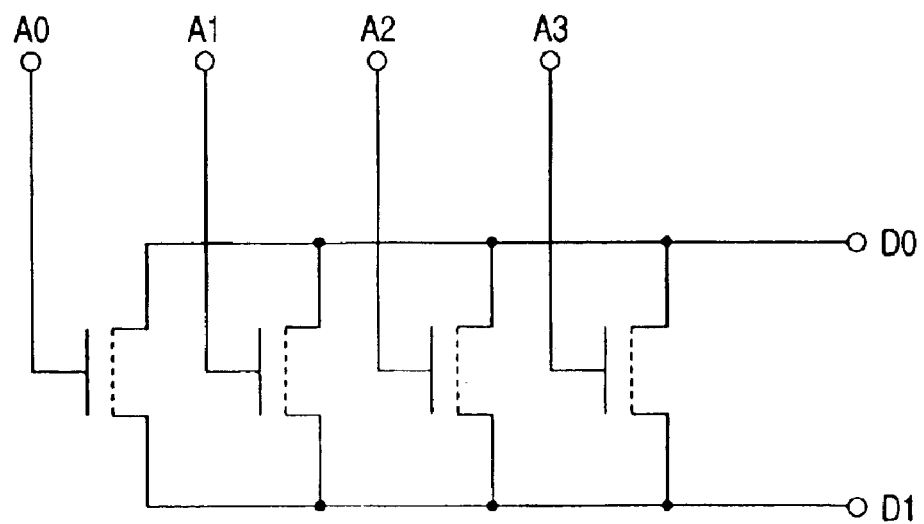
FIG. 18 is an equivalent circuit diagram explaining an OR gate.
Figure 19:
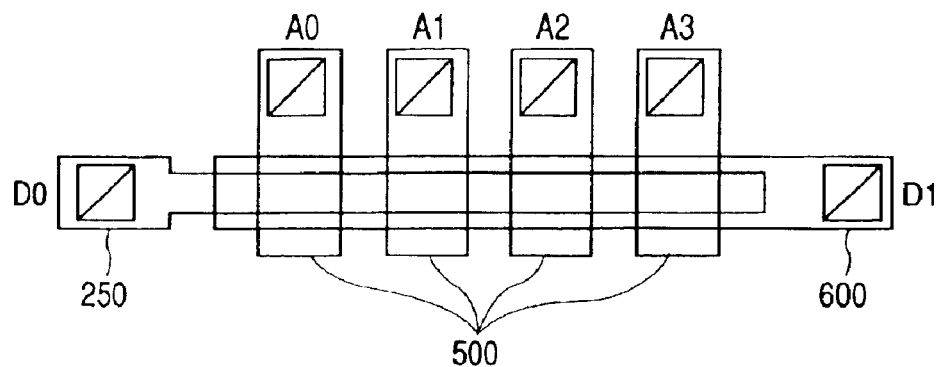
FIG. 19 is a plane layout diagram explaining a plane layout of the OR gate.

FIG. 18 is an equivalent circuit diagram showing a 4-input OR circuit and FIG. 19 is a diagram showing a plane layout of corresponding electrode portions. In FIG. 19, for illustrating an entire layout, there are shown only gate layers 500, pad portion 600, and electrode 250 as a pad layer, as well as respective contacts.

Although the circuit itself shown in FIG. 18 is a conventional circuit, the present invention is characteristic in the structure of a channel region in an insulated gate field effect transistor which constitutes this circuit and also in the structure for taking out its constituent portions.

Figure 20:
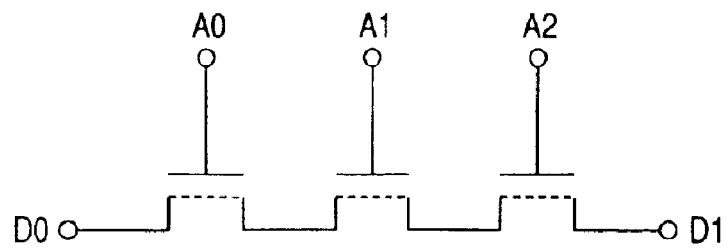
FIG. 20 is an equivalent circuit diagram explaining an AND gate.
Figure 21:
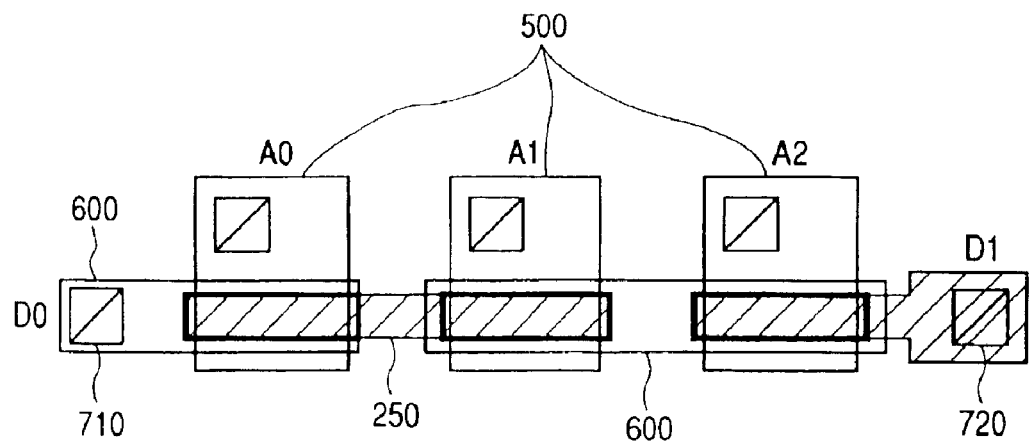
FIG. 21 is a plane layout diagram explaining a plane layout of the AND gate.

FIG. 20 is an equivalent circuit diagram of a 3-input AND circuit and FIG. 21 is a diagram showing a plane layout of corresponding electrode portions. By connecting the pad portion 600 and the electrode 250 in an alternate manner there can be formed a series connection of devices on the circuit. Thus, this example is extremely advantageous in attaining the reduction of size. In FIG. 21, for making this state easier to understand, the electrode layer 250 as an upper pad layer is hatched.

As noted earlier, by using the structure of the invention and by suitably selecting an impurity there can be formed such a complementary device as CMOS. This is because in the structure of the present invention the conduction type of an impurity to be doped can be changed by an ion implantation method at the time of forming the electrode 250.

Figure 22:
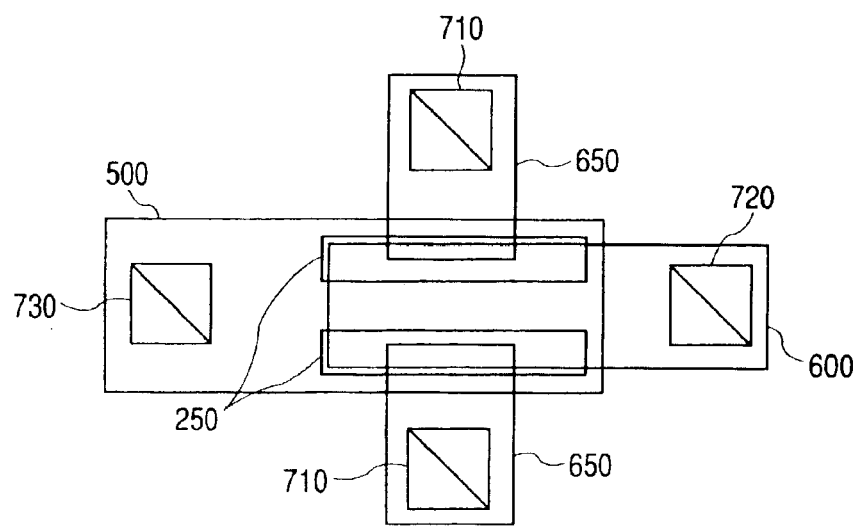
FIG. 22 is a plane layout diagram explaining a plane layout of an inverter gate.

FIG. 22 is a diagram showing a plane layout of an electrode portion in an example of an inverter. The inverter of this example is formed using semiconductor devices with N and P type channel regions in accordance with the structure of the present invention. Two upper and lower electrodes 250 are doped with arsenic and boron, respectively. A gate contact 730 is an input terminal, while a contact 720 to a pad 600 is an output terminal. Ground potential and power-supply potential are fed to the electrode layers 250 through wirings 650.

Figure 23:
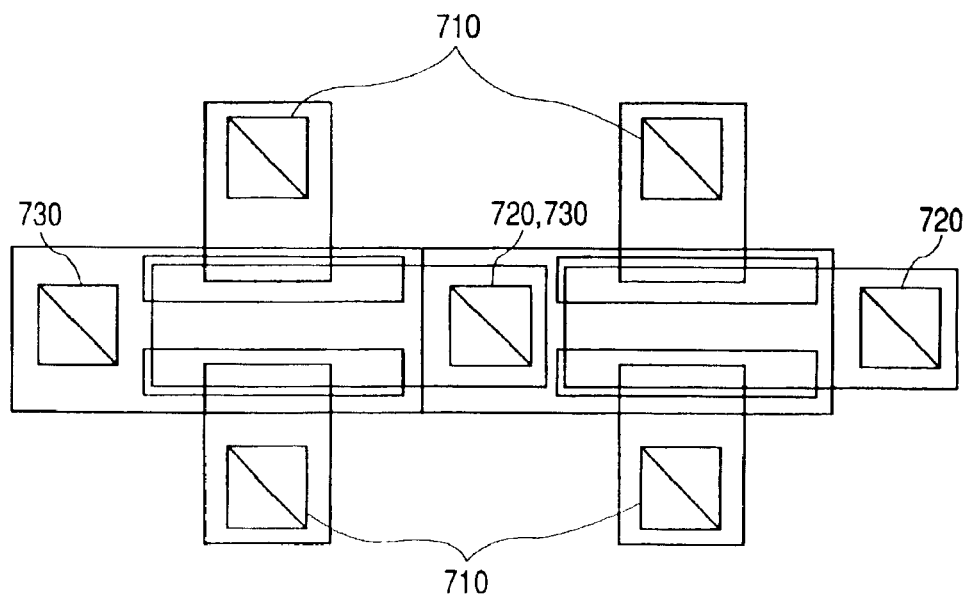
FIG. 23 is a plane layout diagram explaining a plane layout of a multi-stage inverter gate.

FIG. 23 is a diagram showing a plane layout of electrode portions in a two-stage connected state of inverters. The structure shown in FIG. 23 corresponds to a two-stage connection of the structure shown in FIG. 22. Two inverters are connected together by overlapping an input 730 and an output 720.

In process, by forming the contact 720 prior to deposition of the gate 500 there can be made a direct connection to the next stage.

Since the device structure according to the present invention uses a vertical structure, the formation of a pad wiring from an upper electrode 250 is one problem to be solved. A pad forming method other than those referred to above will now be described with reference to FIGS. 24 to 29, which are sectional diagrams of a semiconductor device embodying the invention, showing manufacturing steps in order.

Figure 24:
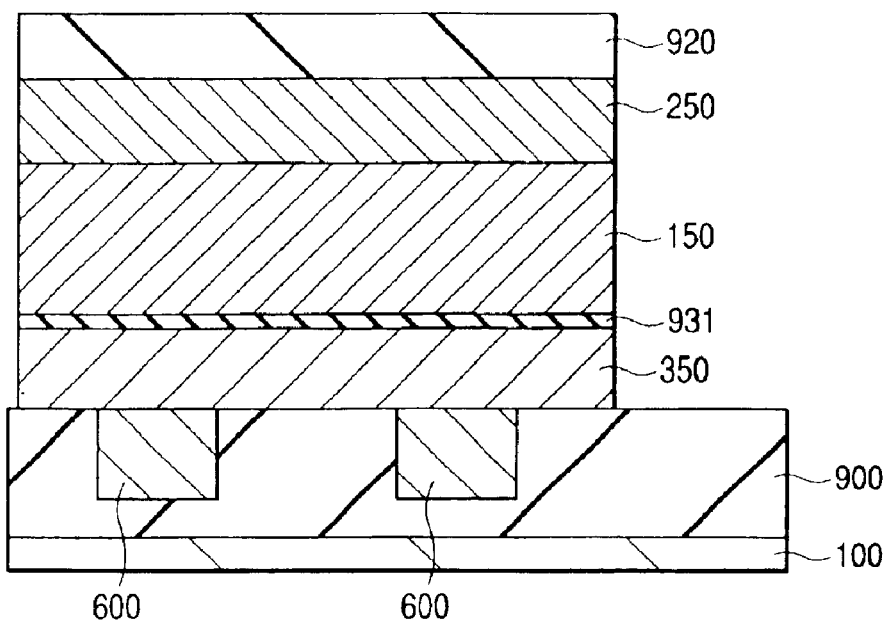
FIG. 24 is a sectional structure diagram explaining a further device manufacturing process.

Through these manufacturing steps there is obtained the same stacked structure as in FIG. 13. More specifically, an insulating film 900 is formed on a semiconductor substrate 100 and buried wirings 600 are formed in the insulating film 900. On the substrate thus coated are then stacked a titanium layer which constitutes a metallic electrode 350, a titanium oxide layer serving as a tunneling insulator 931, a polycrystal silicon layer serving as a channel region 150, a titanium layer which constitutes a second conductive region 250, and a silicon oxide layer as an upper insulator layer 920. Then, patterning is conducted by a conventional method for obtaining a desired shape in the carrier traveling direction of the field effect transistor, i.e., in the channel direction. FIG. 24 shows sections of column-shaped stacked layers (350, 150, 250, 920) having been subjected to patterning in the direction perpendicular to the paper surface. (FIG. 24)

Figure 25:
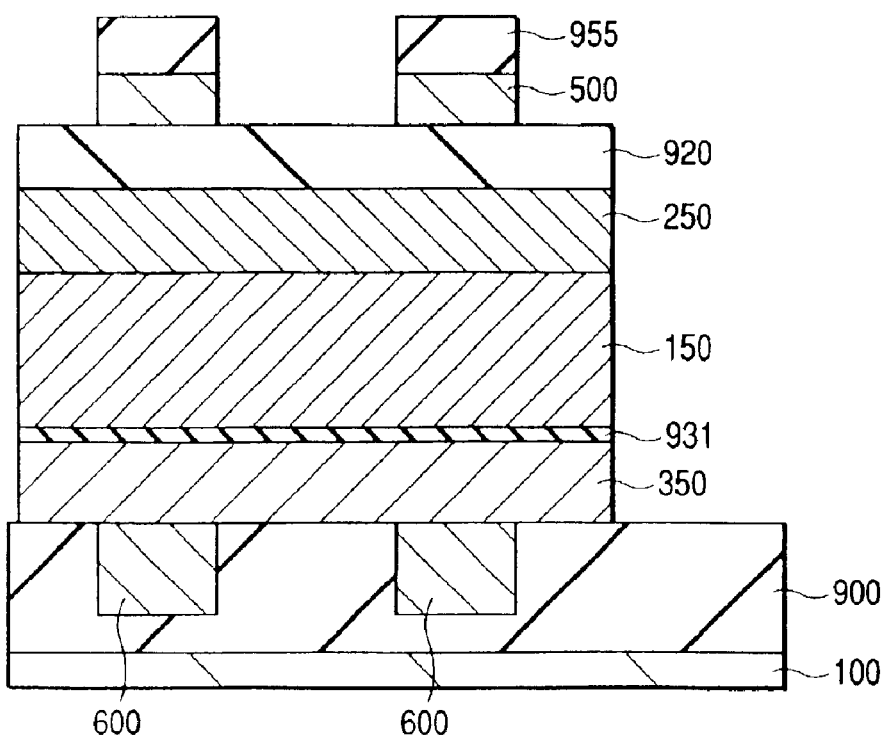
FIG. 25 is a sectional structure diagram explaining the further device manufacturing process.

Further, after the formation of a gate insulating film, a gate electrode layer 500 and an insulating film 955 are stacked on the substrate. Although the gate insulating film is present between the layers 500 and 920, it does not appear in the sectional diagram of FIG. 25. As the insulating film 955 there was used a silicon nitride film. These stacked components, as well as the layers 500 and 955, are subjected to patterning into a desired shape. In the sectional diagram of FIG. 25 there are shown gate sections on only the column. For example, as is seen in FIG. 16, the layer 500 is formed deeply in the trench 105, meaning that a similar structure is present also in this embodiment. (FIG. 25)

Figure 26:
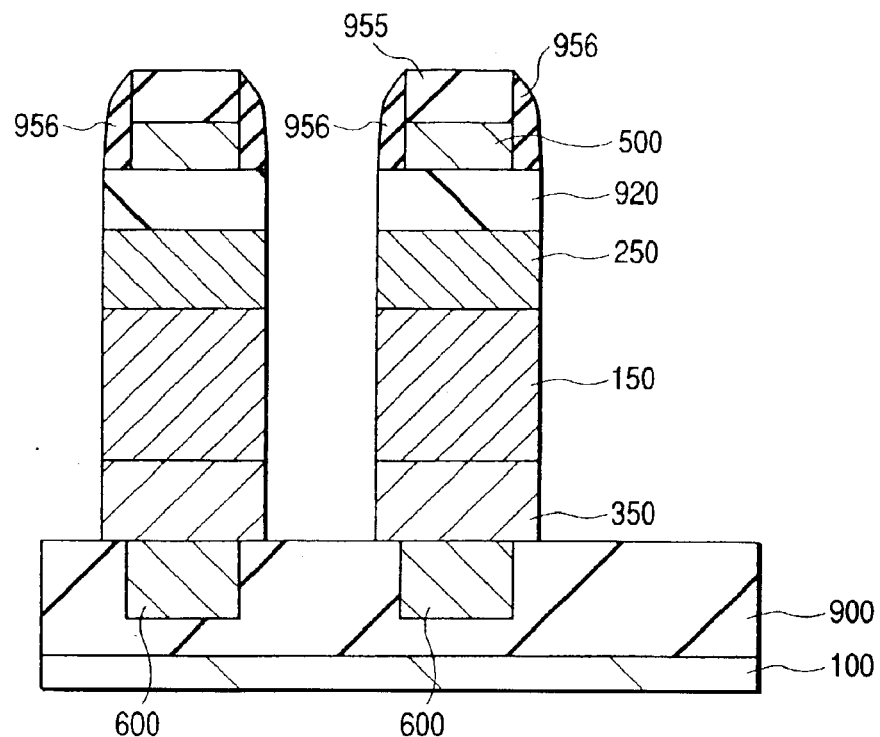
FIG. 26 is a sectional structure diagram explaining the further device manufacturing process.

Next, an insulating film 956 serving as a spacer is deposited on side walls of the layers 500 and 955. With the regions of the insulating films 955 and 956 as mask regions, the stacked films 920, 250, 150, and 350 are subjected to etching in a desired shape. The insulating films 955 and 956 may be formed, for example, by the conventional CVD technique. (FIG. 26)

Figure 27:
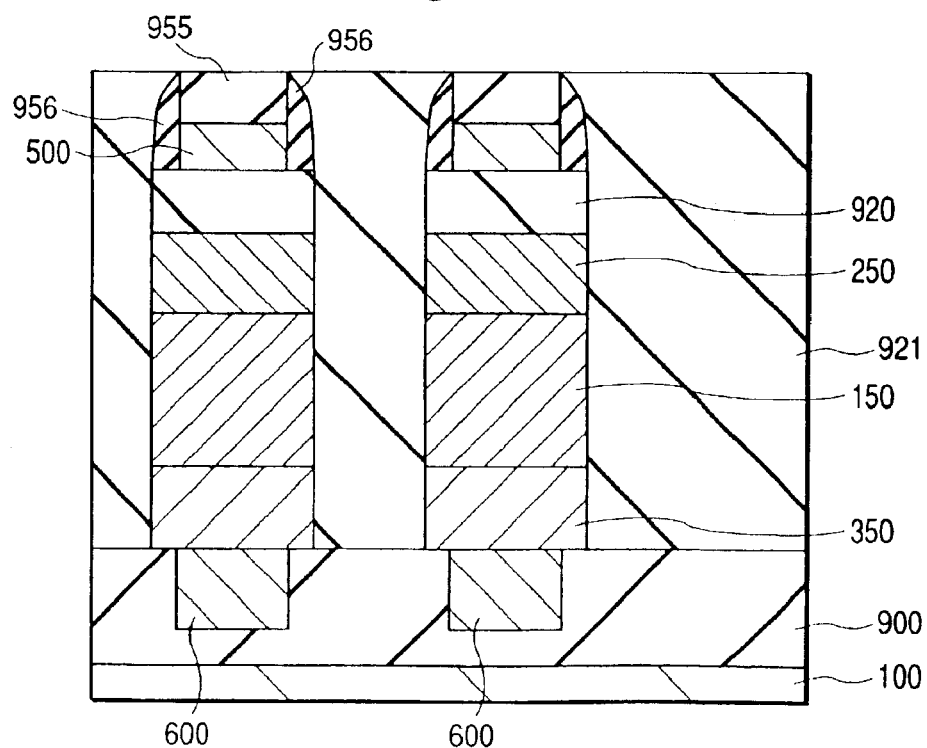
FIG. 27 is a sectional structure diagram explaining the further device manufacturing process.

An oxide film 921 is then deposited on the substrate and the surface of the stacked layer is planarized by the CMP method. (FIG. 27)

Figure 28:
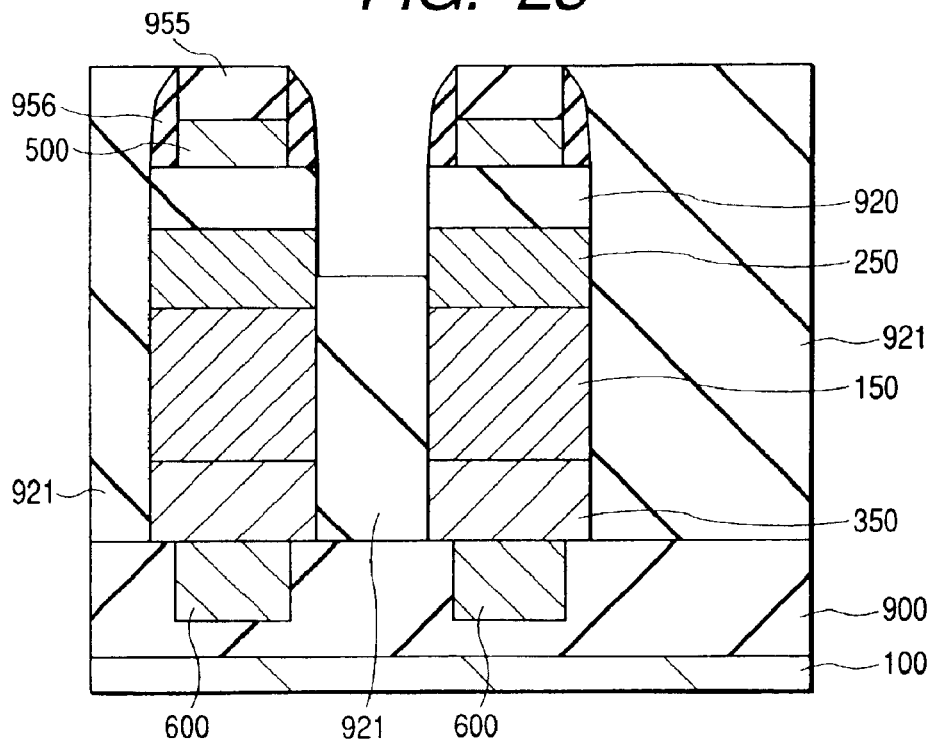
FIG. 28 is a sectional structure diagram explaining the further device manufacturing process.

A mask having an opening in the region corresponding to a pad forming region is applied and a trench is formed with the region of the insulating films 955 and 956 as a mask region, allowing a side face of the conductor layer 250 to be exposed. (FIG. 28)

Figure 29:
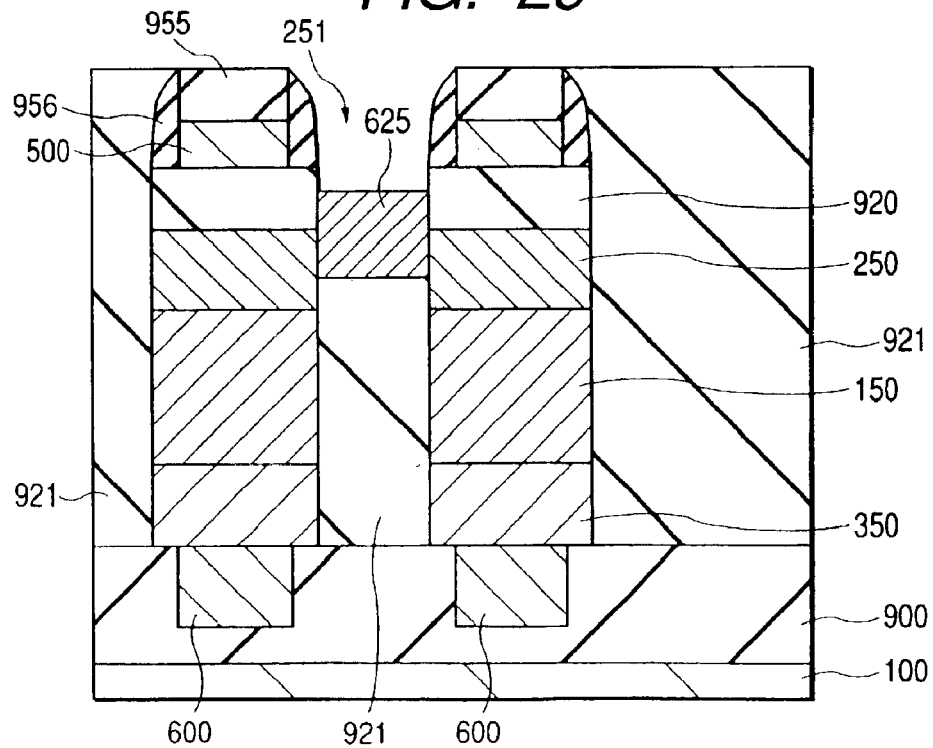
FIG. 29 is a sectional structure diagram explaining the further device manufacturing process.

A pad wiring is formed by burying a tungsten 625 into the trench. In this way it is possible to connect adjacent devices with each other in a self-aligned manner. To be more specific, the regions of the conductive layers 250 are spaced from each other by a trench portion 251 in FIG. 29, but are electrically connected with each other through the tungsten layer 625. The size of the tungsten layer 625 is defined by the trench 251 formed previously. Thus, in this embodiment, the formation of the trench forming mask defines the subsequent dimensions. (FIG. 29)

The semiconductor device according to the present invention is characteristic in that the leakage from electrodes can be kept extremely low. For making the most of this characteristic, it is suitable to apply this characteristic to memory elements which store information by an electric charge. Above all, its application to the type called gain cell can afford a superior semiconductor memory device.

Figure 30:
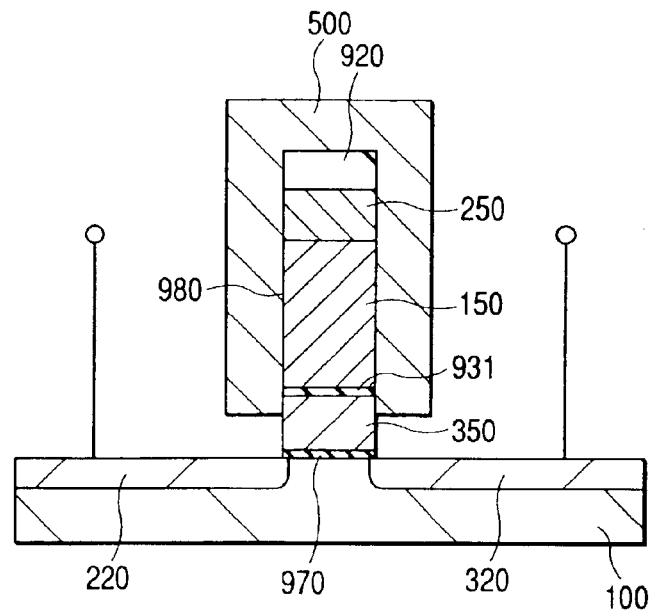
FIG. 30 is a sectional structure diagram showing a memory cell device structure schematically.

FIG. 30 is a sectional diagram showing an example in which the semiconductor device according to the present invention is applied to a gain cell, with only principal portions being illustrated schematically. The memory cell comprises a read section using a device formed on a semiconductor substrate 100 and a write section using a device according to the present invention.

Ordinary impurity regions 220 and 320 are formed on the semiconductor substrate 100 to constitute a channel region of a field effect transistor. A gate insulating film 970 is formed so as to cover the channel region. The transistor section thus configured serves as the aforesaid read section, on which is then formed the following write section. Since the semiconductor device serving as the write section is the device according to the present invention described above, a detailed description thereof will here be omitted. In FIG. 30, the reference numeral 931 denotes a tunneling insulator, numeral 150 denotes a semiconductor layer serving as a channel, numeral 250 denotes a second conductor layer, numeral 980 denotes a gate insulating film, and numeral 500 denotes a gate electrode layer.

A conductive region 350 serving as an electrode is formed directly on the gate insulating film 970, serving not only as a drain of the write section but also as a gate electrode of the read section. In this memory cell, information is stored by the electric charge held in the electrode 350 and the channel characteristic is changed by a field effect imposed on the read section, whereby information is read as a current flowing between the electrodes 220 and 320. The leakage current in the conductive region 350 as a storage node is reduced and this affords a satisfactory information holding performance. Since the conductive region 350 is a storage node, the resistance value is not so important. Therefore, the conductive region and electrode layer may be formed using a polycrystal silicon which has been metallized by heavily doping an impurity.

Figure 31:
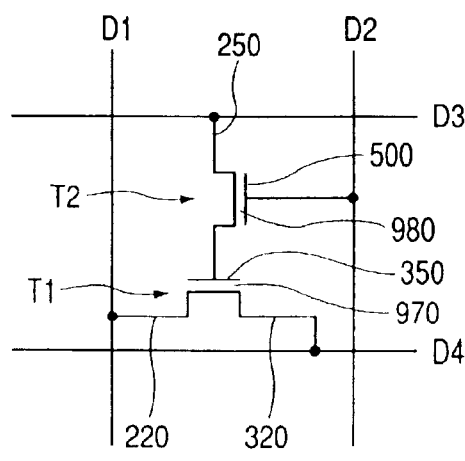
FIG. 31 is an equivalent circuit diagram explaining a memory cell.
Figure 32:
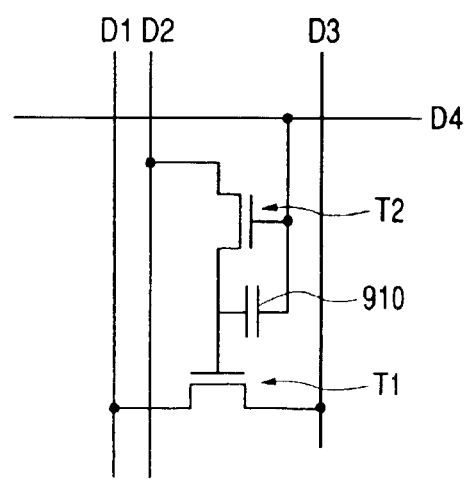
FIG. 32 is an equivalent circuit diagram explaining another memory cell.

Examples of basic circuit configurations of typical memory cells are shown in FIGS. 31 and 32. Operations of these memory cells will be described below.

FIG. 31 is a circuit diagram of a memory cell, showing the semiconductor device of FIG. 30 in an equivalent manner. For making the circuit easier to understand, corresponding reference numerals used in the structural diagram of FIG. 30 are given to two transistors T1 and T2 shown in FIG. 31. T1 is a transistor which constitutes a read section and T2 is a write section using the semiconductor device according to the present invention.

D1 is a read word line, D2 is a write word line, D3 is a write date line, and D4 is a read data line. By turning D2 ON, D3 potential is written in the storage node (gate electrode), and by turning it OFF, an electric charge is held in the storage node. At this time, a read element gate potential is determined. For example, in the case where the gate potential exceeds the transistor threshold, a current flow is created by giving a potential difference between D1 and D4, while if the gate potential is lower than the threshold value, there will be no current flow even if a potential difference is given between D1 and D4. Thus, the gate potential can be read out by the electric current.

Figure 59:
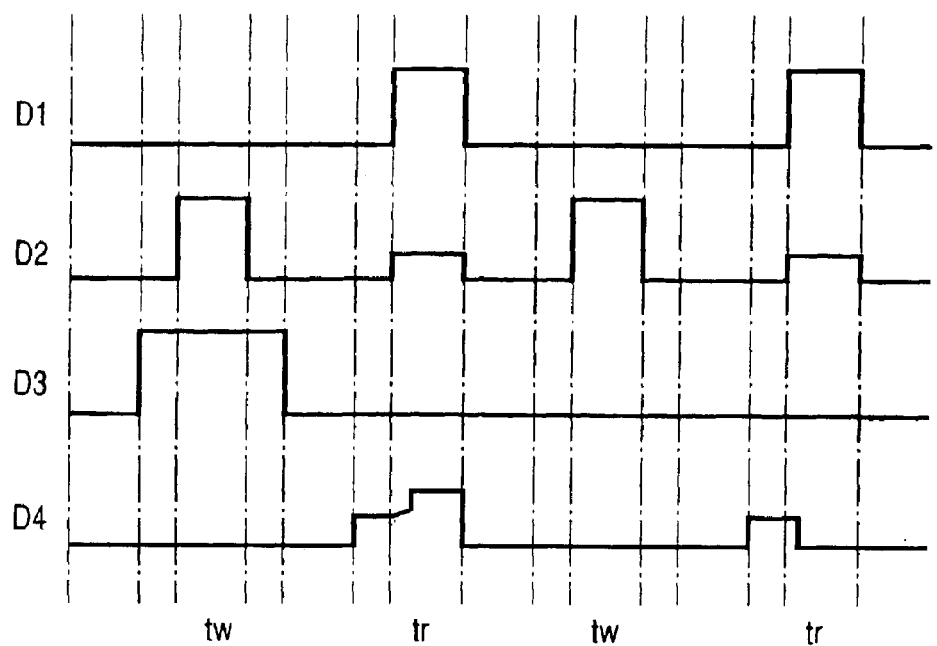
FIG. 59 is a time chart for basic operations of a semiconductor memory.

FIG. 59 is a time chart of signals used in the above example. In the same figure, D1, D2, D3, and D4 represent the application of voltage to the read word line, write word line, write data line, and read data line, respectively, and there are used wiring symbols shown in FIG. 31. FIG. 59 shows an example in which write (tw) and read (tr) are repeated by a memory cell which uses a single conductive type element as a read element. In this example, a change in potential of D4 is read and a sense amplifier is used for driving. D4 is once given an intermediate potential before the step tr and information is read in accordance with a subsequent change.

In this structure, the write section and the read section are separated from each other in operation, so even if integration is made, there does not arise the problem that a read operation destroys information in another cell. In the equivalent circuit diagram shown in FIG. 31, D1 to D4 are arranged so that a set of D1 and D2 and a set of D3 and D4 are arranged each in parallel geometrically. In an actual semiconductor device structure, however, it suffices for D1 to D4 to be arranged so that at least D1 and D4, as well as D2 and D3, are respectively orthogonal geometrically. It is not always necessary that D1 and D2, as well as D3 and D4, be respectively arranged in parallel geometrically. This is because read and write are separated from each other.

In FIG. 32, D4 is allowed to serve as both write and read word lines. For the explanation of operation, a capacitor 910 is added positively. However, an actual structure can be realized without adding any special process because there is an overlap between the electrode 350 and the gate 500. As the capacitance in question there may be established a so-called parasitic capacitance.

In the same figure, D1 and D3 are read data lines, D2 is a write data line, and D4 is a word line. If write and read elements are formed using different conductive types, there can be attained a complementary operation. For example, if write and read elements are assumed to be P and N types, respectively, the write element turns ON upon application of a negative potential to the word line D4, whereby the potential is written. On the other hand, in the read element, the application of a positive potential causes the channel to turn ON. That is, the application of a positive potential to D4 induces a capacitance coupling, whereby the positive potential can be provided to the gate of the read element. At this time, in the write element, since the OFF state thereof becomes stronger, it is possible to suppress the leakage of an electric charge. In the conventional gain cell, due to impossibility of a complementary operation, it has been necessary to provide the highest gate voltage in writing (erasing) operation and read the stored information with a lower voltage so as not to destroy the information. Consequently, a potential range employable as information is narrow and it has been difficult to hold a multi-level information. In a complementary operation, such a restriction is not imposed on the word line potential in a read operation, thus permitting the use of a multi-level information (multistage potential state).

Figure 60:
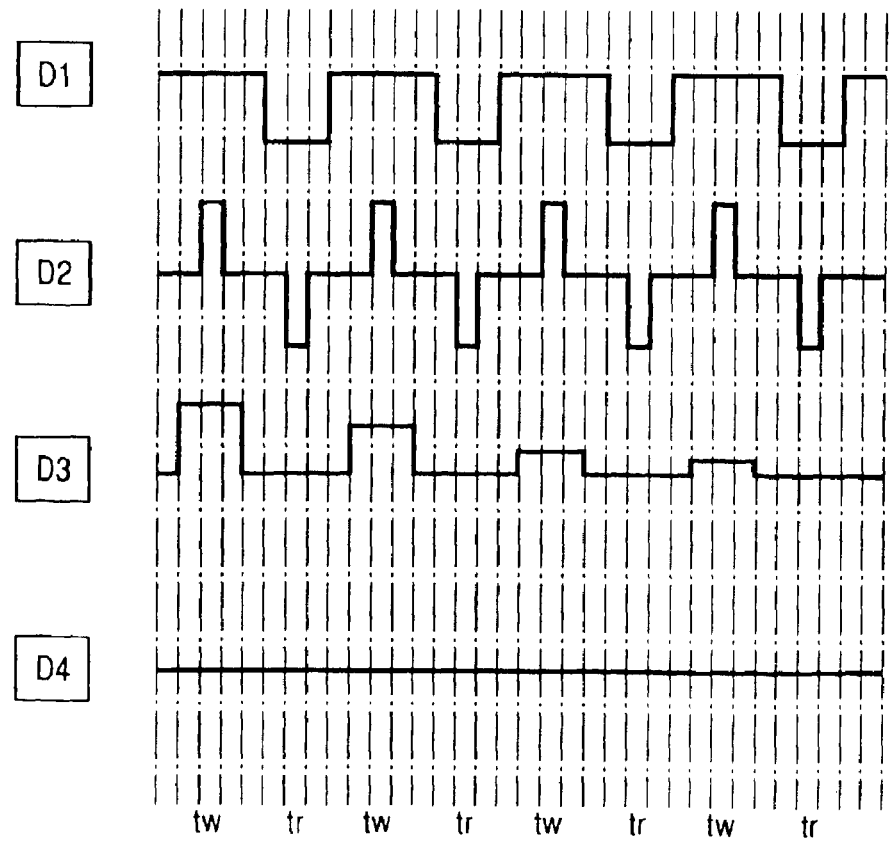
FIG. 60 is a time chart for basic operations of a semiconductor memory device which handles multi-level information.

FIG. 60 is a time chart of basic operations of a complementary type memory cell. The memory cell is characteristic in that D2 is biased in opposite directions in write (tw) and read (tr). FIG. 60 shows an example in which quaternary potential values are written successively in a storage node and a read operation is repeated with respect to each of them. In this example, D4 current sense is provided and operation is allowed to proceed at a constant potential. D1 and D3 stand for read data lines, D2 stands for a write data line, and D4 stands for voltage for a word line. Reference to the voltage condition of D3 shows that, for example, a substantially quaternary information is employable.

Besides, since the gate potential in a read operation is not restricted by data destruction, it is possible to apply a potential freely to the gate, thus also permitting a stored charge condition to be read as a continuous condition, not as a digitized condition. Moreover, since the result of read is given by both applied gate voltage and stored charge condition, it is employable in performing arithmetic operations.

Figure 33:
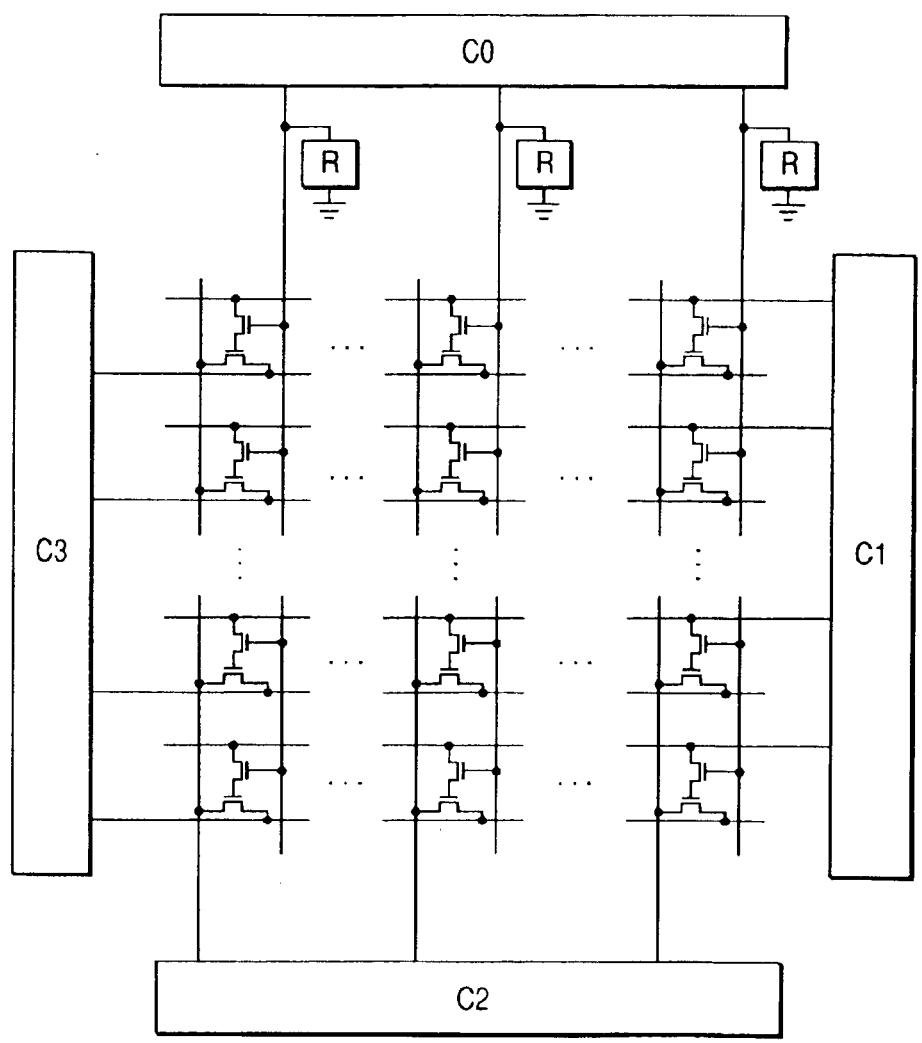
FIG. 33 is an equivalent circuit diagram explaining a memory cell array.

FIG. 33 shows an example in which the memory cell of FIG. 31 is in an array configuration. In the same figure, C0 is a driver portion of a write word line, C1 is a driver portion of a write data line, C2 is a driver portion of a read word line, and C3 is a sense portion of a read data line. Each memory cell portion in FIG. 33 is as described previously, so the details thereof are here omitted. In this example there may be adopted a drive method usually employed for a memory device.

The suppression of leakage current in the semiconductor device structure according to the present invention is attained by effectively controlling, with use of a gate electrode, the tunneling effect of an insulating film sandwiched between an electrode and a channel portion. For reducing the leakage current it is important to appropriately hold the potential relation between the write element gate and the drain electrode as a storage node. In view of this point, in the application of this memory cell it is effective to use a device R which can stabilize the write word line in a certain potential state.

As an example of the device R, the connection of a resistor suffices, as noted earlier. With the device R, it is possible to set the potential of the write word line normally at the ground potential.

To be more specific, even if this memory device is disconnected from the power supply, it is possible to hold information for a long time because the word line is fixed to the ground potential and the leakage current can be suppressed. If a resistor R is used as the device R, the power consumption increases in a state of operation, namely, in a selected state of a word line, but it is one word line to be selected at most in the array. Therefore, by selecting a resistor of an appropriate size it is possible to obtain a good information holding characteristic without so much increasing the power consumption.

Figure 34:
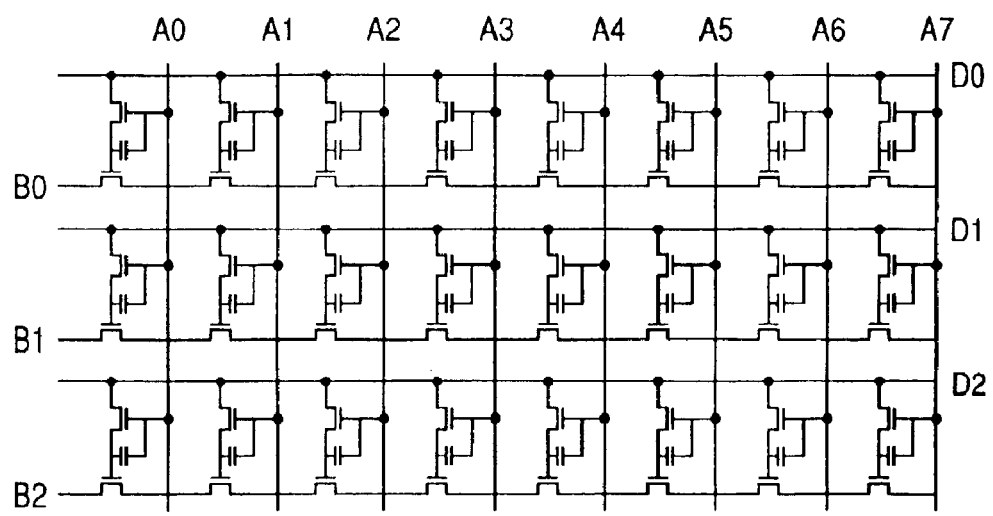
FIG. 34 is an equivalent circuit diagram explaining a memory cell array.

Even with use of the memory cell shown in FIG. 32, it is possible to form a memory array like that shown in FIG. 33. On the other hand, as shown in FIG. 34, it is effective to build a so-called NAND type array with memory cells stacked in plural stages. This is for the following reason. Since it is possible to perform a complementary operation, cells connected to B0, B1, and B2 which are the read data lines can be turned ON by applying voltage successively from A0 to A7. Since the data lines are formed by both diffusion layer and channel, it is possible to reduce the number of wirings and contacts to be formed. Consequently, scaling-down of memory cells becomes easier and it is possible to effect a high integration.

Now, with reference to FIGS. 35 to 40, a typical memory cell forming process will be described. These figures illustrate a sectional structure of a semiconductor device. On both sides of a central gap there are shown separate sectional states. In the left-hand section of each figure, gate electrodes 500 extend perpendicularly to the paper surface, while in the right-hand section, the gate electrodes 500 are included within the paper plane.

Figure 35:
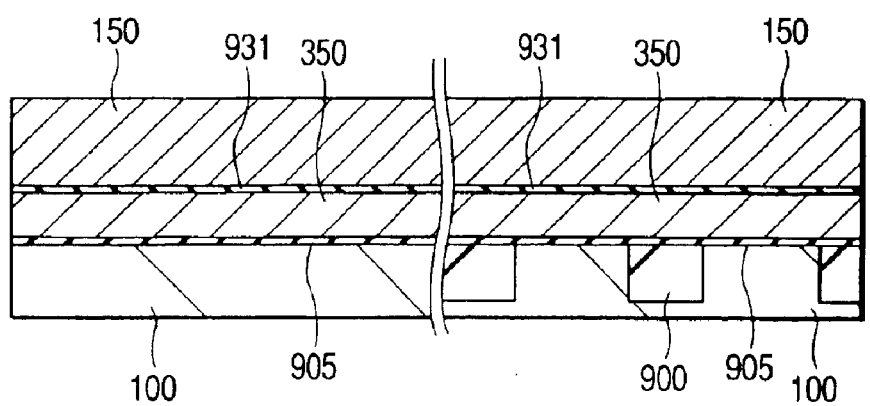
FIG. 35 is a sectional structure diagram explaining a memory cell manufacturing process.

On a silicon substrate 100 is formed a dielectric 900 for device isolation by a shallow trench isolation method which is used for the formation of an ordinary MOSLSI. Next, the resulting exposed silicon surface is subjected to a thermal oxidation to form a gate insulating film 905 for a read element, on which are then stacked a metallic electrode 350 as a memory node, a tunnel film 931, and a channel 150. (FIG. 35)

A semiconductor layer as the channel region 150 and the electrode 350 are subjected to patterning into a desired shape by the conventional photoresist method to form a trench 105.

Figure 36:
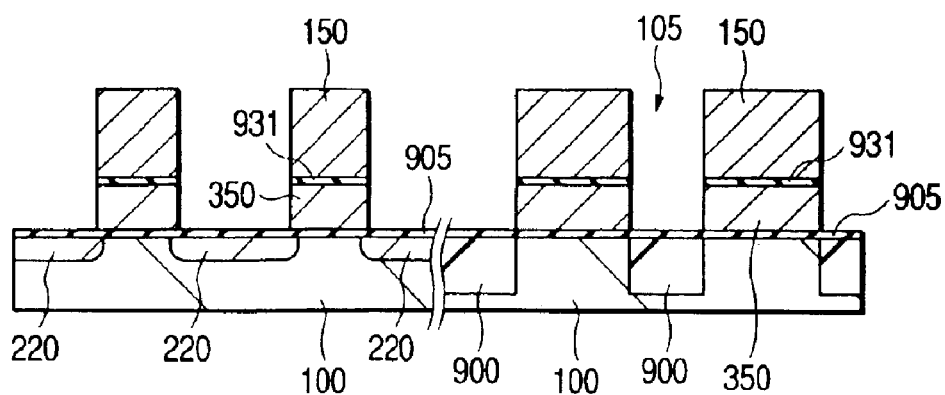
FIG. 36 is a sectional structure diagram explaining the memory cell manufacturing process.

Next, ion implantation is performed for the resulting opened region to form a diffusion layer 220. (FIG. 36)

Figure 37:
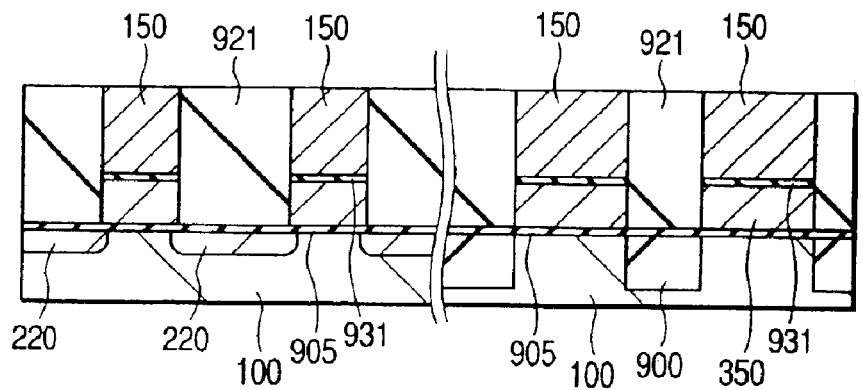
FIG. 37 is a sectional structure diagram explaining the memory cell manufacturing process.

An oxide film 921 is deposited on the substrate thus processed and the surface thereof is planarized by the CMP method, followed by etching back until exposure of polycrystal silicon 150. (FIG. 37)

Figure 38:
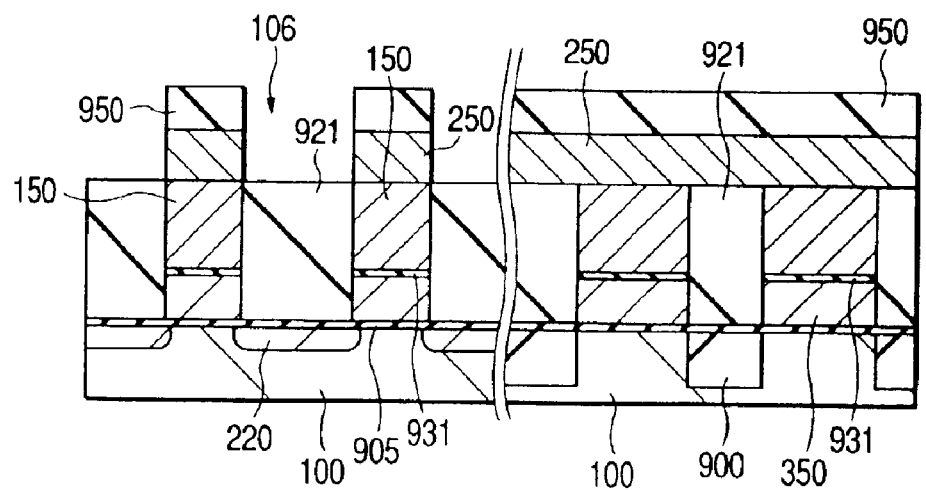
FIG. 38 is a sectional structure diagram explaining the memory cell manufacturing process.

After subsequent formation of a thin nitride film for the suppression of impurity diffusion, a polycrystal silicon 250 heavily doped with an impurity is deposited. The polycrystal silicon 250 is then processed into a desired shape for use as a write data line 250. The above nitride film formed for the suppression of impurity diffusion is not shown in the figure. (FIG. 38)

Figure 39:
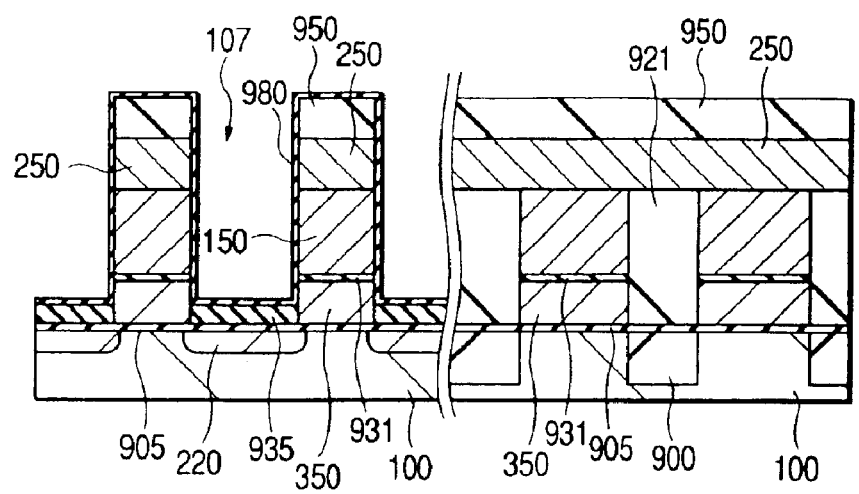
FIG. 39 is a sectional structure diagram explaining the memory cell manufacturing process.

The oxide film in a gate forming portion for the write element is etched to form a trench 107. A gate insulating film 980 is deposited on at least side faces of the thus-exposed channel region 150. An insulating film formed on a diffusion layer is known to be marked in its deterioration of breakdown voltage. In this example, therefore, an insulating layer 935 serving as a spacer is formed to improve the breakdown voltage. On the substrate, except the spacer and the diffusion layer, there may be formed a gate insulating film, thereby allowing a source and a drain to be formed by an inversion layer based on the field effect of the gate instead of the diffusion layer. (FIG. 39)

Figure 40:
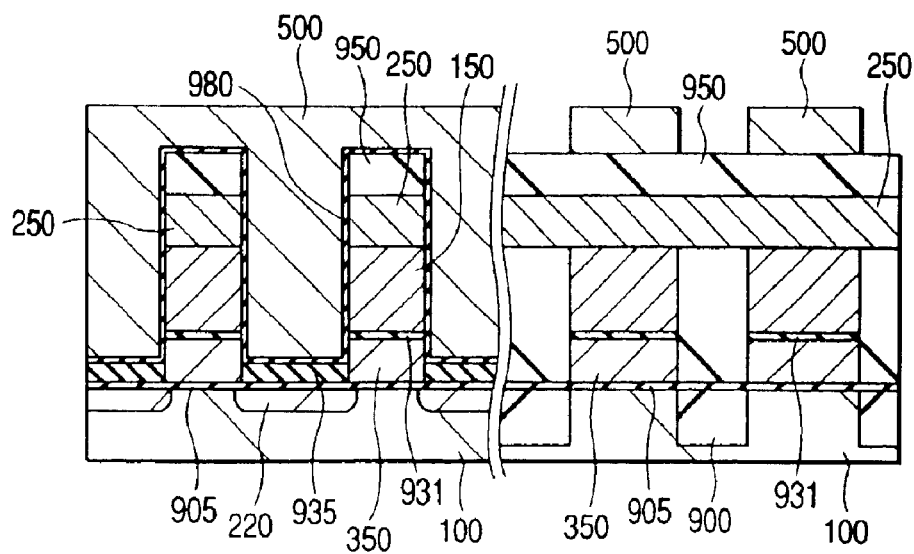
FIG. 40 is a sectional structure diagram explaining the memory cell manufacturing process.

A gate layer 500 is formed and is then subjected to patterning as a write word line. The gate 500 thus formed into a desired shape is shown in the right-hand section of FIG. 40, while in the left-hand section of the same figure there is shown a gate electrode which is present in the trench 107. Since this memory cell is formed on the silicon substrate, it can be integrated in good consistency with the conventional MOSFET. (FIG. 40)

Next, with reference to FIGS. 41 to 46, a description will be given below about another memory cell forming method different from the above method. In these figures, as in the above method, two sectional structures are shown in combination.

Figure 41:
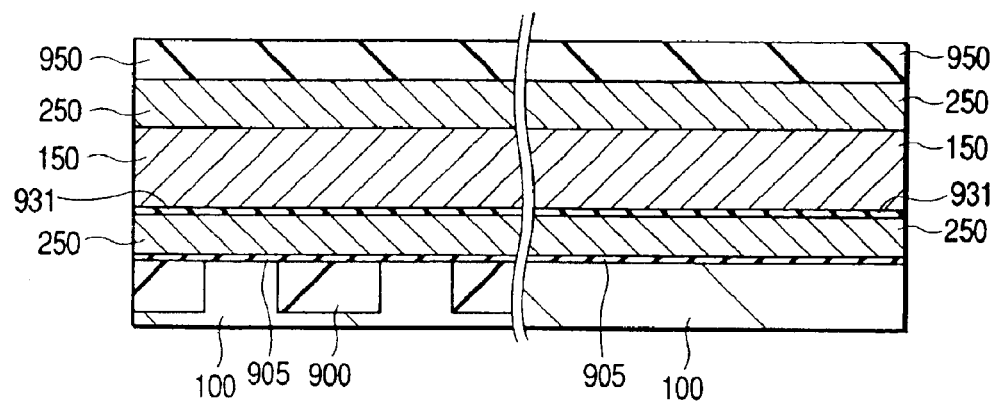
FIG. 41 is a sectional structure diagram explaining another memory cell manufacturing process.

On a silicon substrate 100 formed with a device isolation region 900 are stacked a gate insulating film 905 of a read element, an electrode 250 serving as a memory node, a tunnel film 931, a channel 150, an upper electrode 250, and a cover layer 950. (FIG. 41)

Figure 42:
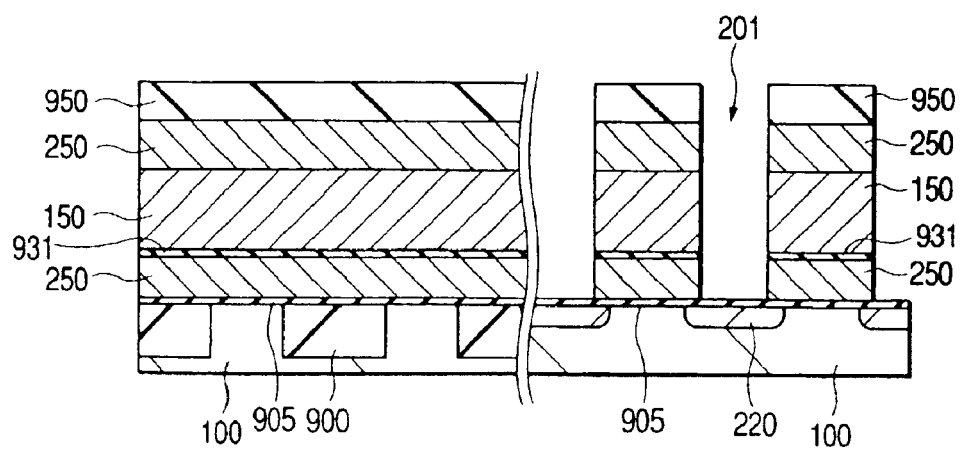
FIG. 42 is a sectional structure diagram explaining the another memory cell manufacturing process.

The thus-stacked layer is then processed in the form of a trench 201 in a read data direction and then an electrode 220 is formed by ion implantation. (FIG. 42)

Figure 43:
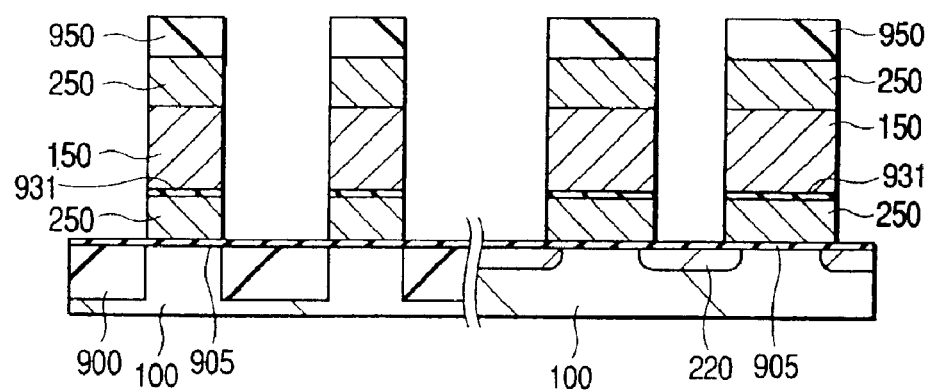
FIG. 43 is a sectional structure diagram explaining the another memory cell manufacturing process.

The stacked layer is processed in a word line direction orthogonal to the data line in accordance with a word line pattern. (FIG. 43)

Figure 44:
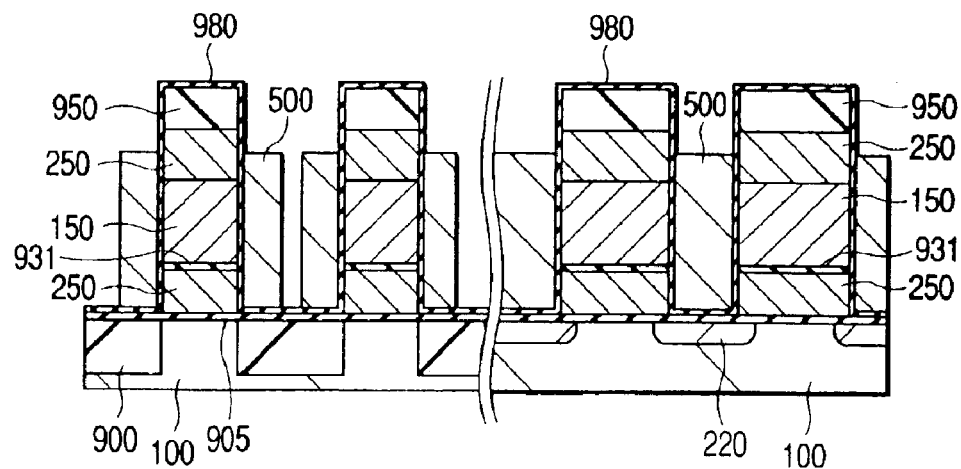
FIG. 44 is a sectional structure diagram explaining the another memory cell manufacturing process.

After the formation of the gate insulating film 980, a gate 500 is deposited, followed by etching, to form a spacer-like gate around the column-shaped stacked layer. In this case, as shown on the right-hand side in the figure, the column spacing in the word line direction is set narrower than in the data line direction (leftward in the figure) and the thickness of the gate 500 to be stacked is set to a value above a half of the spacing in the word line direction and a half of the spacing in the data line direction, whereby the gate electrode can be connected self-alignedly in only the word line direction. (FIG. 44)

Figure 45:
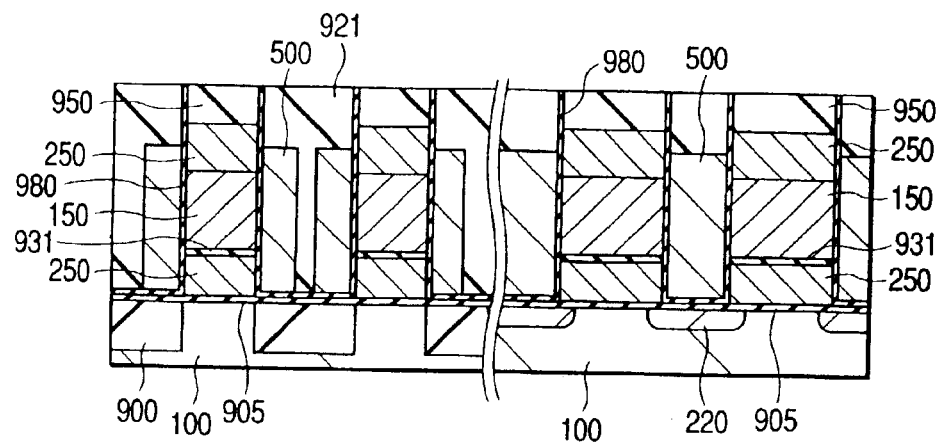
FIG. 45 is a sectional structure diagram explaining the another memory cell manufacturing process.

Then, an inter-layer film 921 is deposited on the substrate thus processed and is planarized, allowing the cover layer 950 to be exposed. (FIG. 45)

Figure 46:
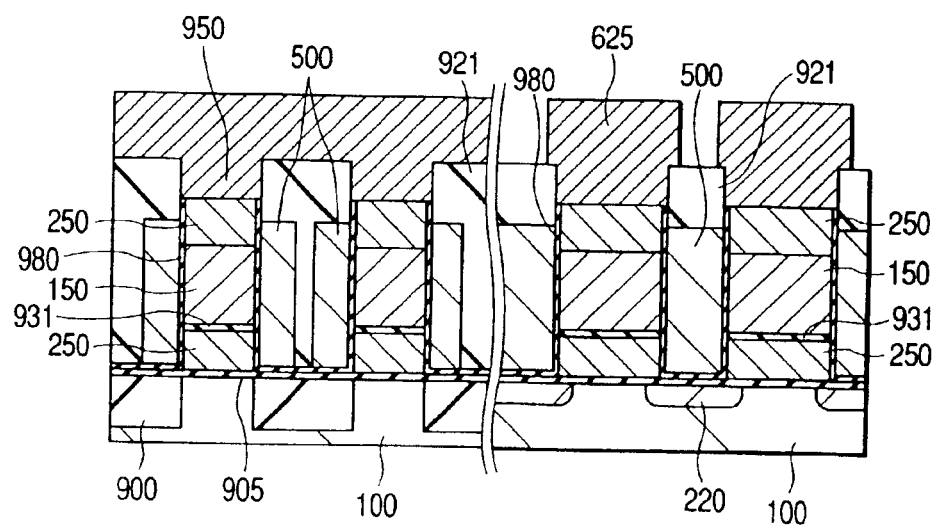
FIG. 46 is a sectional structure diagram explaining the another memory cell manufacturing process.

The cover layer 950 is removed and a metal wiring 625 is deposited. By machining the metal wiring 625 into a desired shape it is possible to form a write data line. (FIG. 46)

Figure 47:
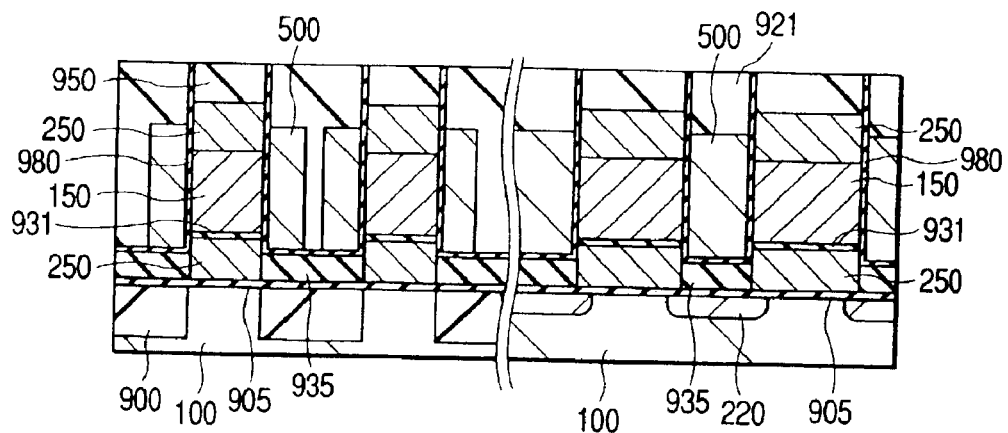
FIG. 47 is a sectional structure diagram explaining a further memory cell manufacturing process.

In this memory cell, by once performing planarization with an oxide film before formation of the gate 500 (after the step shown in FIG. 41) and subsequent etching back, there can be formed a shielding layer 935. (FIG. 47) By so doing, it is possible to reduce cross interference of write and read elements and improve the breakdown voltage of the read element.

Figure 48:
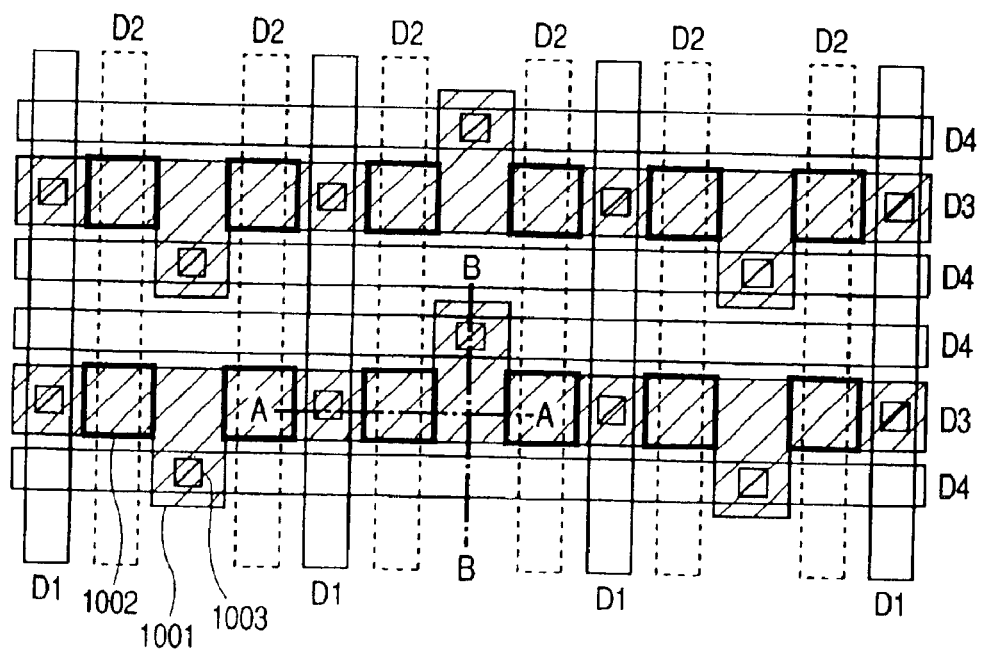
FIG. 48 is a plane layout diagram explaining a plane layout of a memory cell array.

A further memory cell forming method will now be described with reference to FIGS. 48 to 58. FIG. 48 is a layout diagram of a semiconductor memory device in which the memory cell shown in FIG. 31 is illustrated in an array configuration. Twelve such memory cells are used herein. D1, D2, D3, and D4 in FIG. 48 correspond to those shown in FIG. 31 respectively. That is, D1, D2, D3, and D4 stand for a read word line, a write word line, a write data line, and a read data line. In FIG. 48, the data lines and the word lines, as well as contact holes and impurity diffusion regions in the substrate, are shown schematically. The read word lines D1 and the read data lines D4, which are represented using thin lines, are disposed in the lower layer of the stacked semiconductor structure, while the write word lines D2, which are represented using thick lines, are disposed in the upper layer of the stacked structure. The hatched regions indicate impurity diffusion regions. Contact holes 1003 represented by thin lines are openings for connection between D3 and D4, or D3 and D1, which are disposed in the lower layer. On the other hand, contact holes 1002 represented by thick lines are openings for connection between D3 and the write word lines D2 disposed in the upper layer.

A more concrete description will be given below with reference to the sectional diagrams of FIGS. 49 to 58.

FIGS. 49 to 58 illustrate A—A and B—B sections in FIG. 48 on the left and right sides, respectively.

FIGS. 49 to 58 illustrate a memory cell forming method using an SOI (Silicon On Insulator) substrate. It goes without saying that also in the foregoing memory cell the read element may be formed on an SOI substrate.

Figure 49:
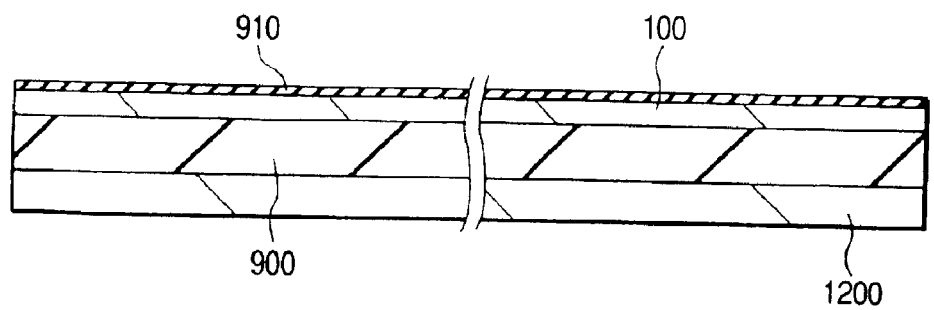
FIG. 49 is a plane layout diagram explaining a plane layout of a multi-stage inverter gate.

First, there is provided a wafer having a silicon layer (SOI) 100, which is formed on a buried oxide film 900 formed on a substrate 1200, and also having an oxide film as a cover layer 910. The substrate 1200 is usually a silicon substrate. Since the substrate has no direct bearing on the basic structure and operation, it will not be shown in the following drawings. (FIG. 49)

Figure 50:
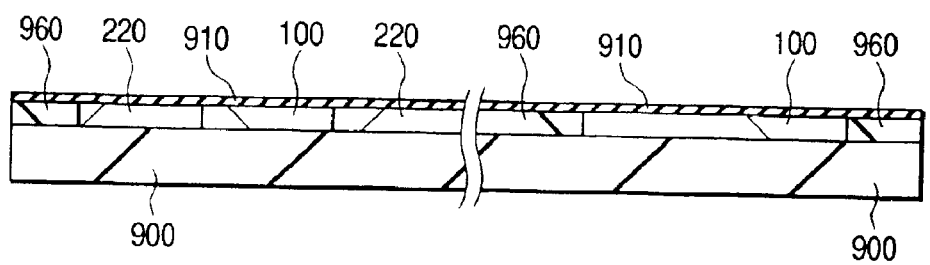
FIG. 50 is a plane layout diagram explaining a plane layout of the multi-stage inverter gate.

By the conventional shallow trench isolation method there are formed a device isolation region 960 and a cover layer 910 again on the wafer. Further, a necessary diffusion layer 220 is formed by heat treatment. (FIG. 50)

Figure 51:
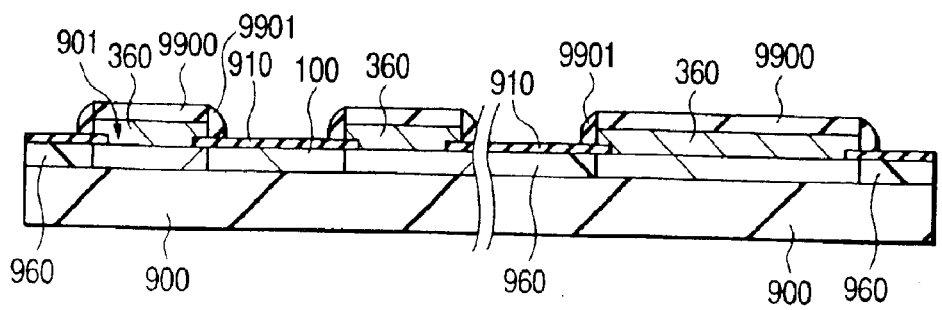
FIG. 51 is a plane layout diagram explaining a plane layout of the multi-stage inverter gate.

In the cover layer 910 are formed openings 901 corresponding to contact forming portions. Then, a heavily doped polycrystal silicon 360 is deposited through the openings 901 to form read word lines and pad layers. Then, insulating films 9900 and 9901 are formed thereon and are subjected to patterning into a desired shape. (FIG. 51)

Figure 52:
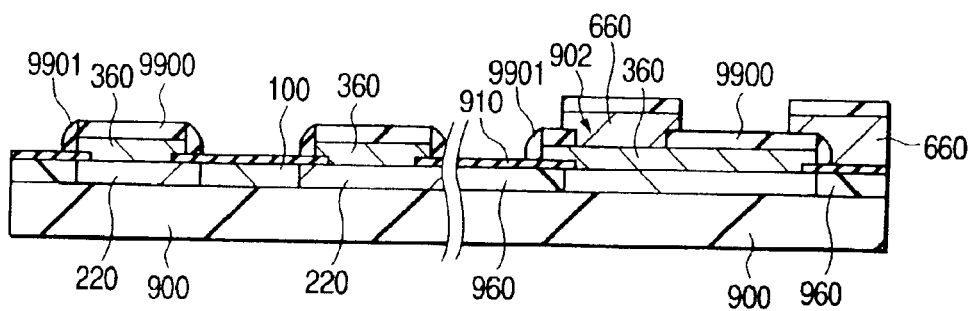
FIG. 52 is a plane layout diagram explaining a plane layout of the multi-stage inverter gate.

Then, contacts are opened at 902 in the upper portions of the pad layers formed on the semiconductor substrate thus processed and again a heavily doped polycrystal silicon film 660 and an inter-layer insulating film 9902 are deposited thereon. The inter-layer insulating film 9902 is then made into a desired shape by a conventional method, and with the inter-layer insulating film 9902 as a mask region, the polycrystal silicon film is formed into a desired shape of a read data line. (FIG. 52)

Figure 53:
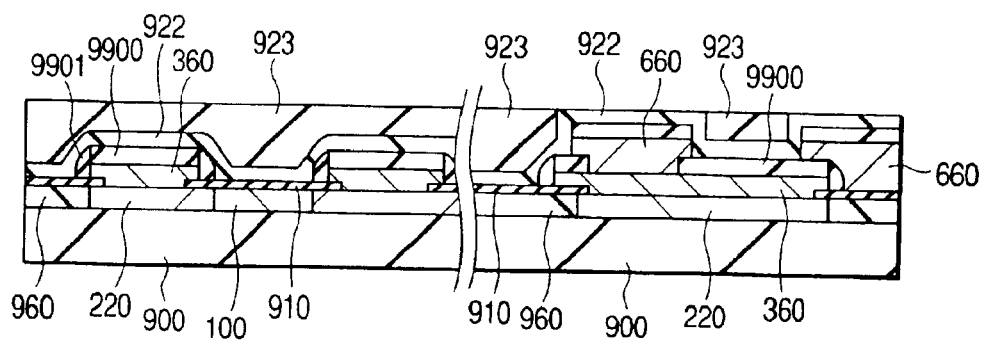
FIG. 53 is a plane layout diagram explaining a plane layout of the multi-stage inverter gate.

Subsequently, inter-layer insulating films 922 and 923 are deposited and their surfaces are planarized by the CMP method. For example, the inter-layer insulating films 922 and 923 are a silicon nitride film and a silicon oxide film, respectively. (FIG. 53)

Figure 54:
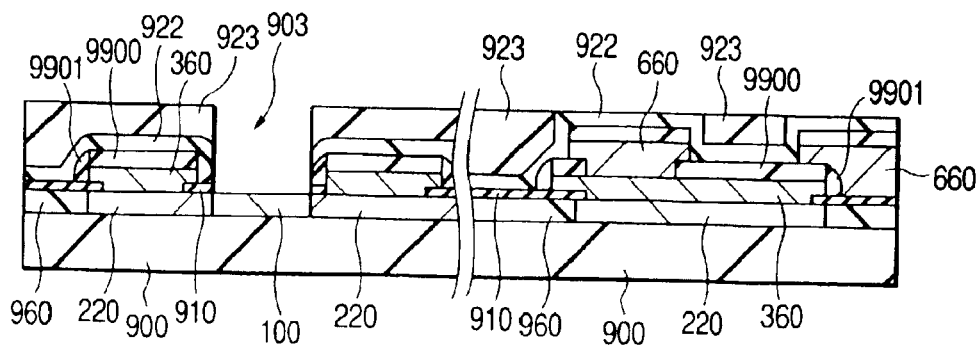
FIG. 54 is a plane layout diagram explaining a plane layout of the multi-stage inverter gate.

Next, the inter-layer film is removed in the write element forming portion to form an opening 903. The surface of the silicon layer 100 is exposed into the opening 903. (FIG. 54)

Figure 55:
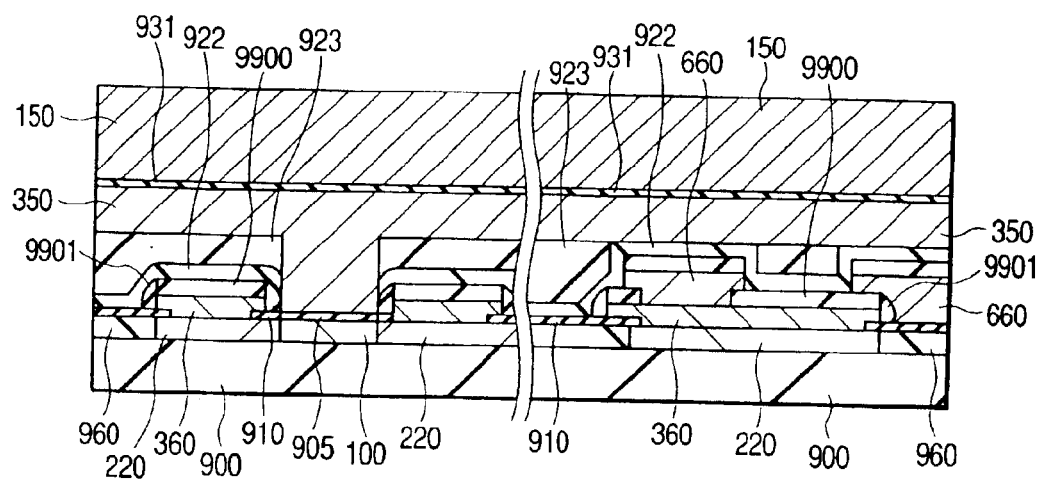
FIG. 55 is a plane layout diagram explaining a plane layout of the multi-stage inverter gate.

Further, a metal electrode 350, a tunnel film 931, and a polycrystal silicon 150 are stacked after the formation of a gate oxide film 905. (FIG. 55)

Figure 56:
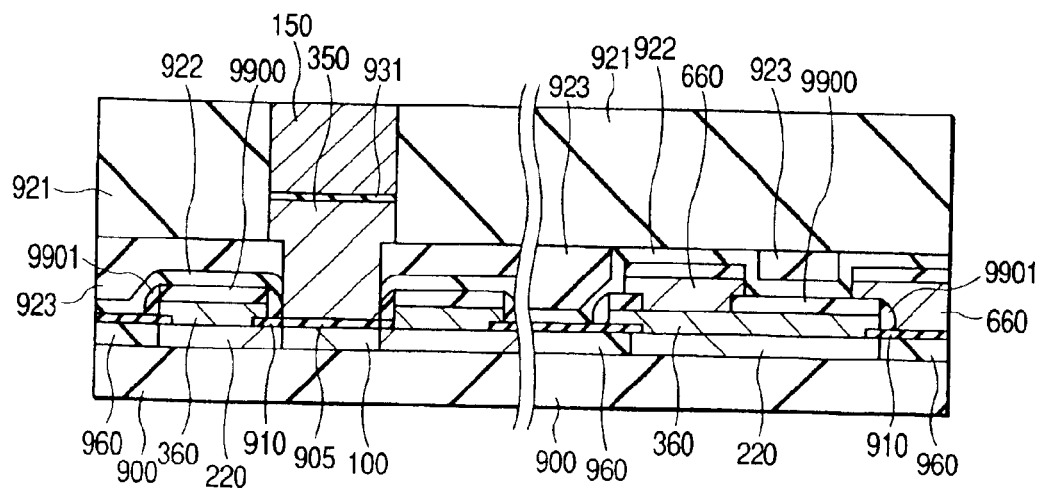
FIG. 56 is a plane layout diagram explaining a plane layout of the multi-stage inverter gate.

The stacked films 350, 931, and 150 are etched into a columnar shape up to the surface of the insulator 923, on which is then deposited an inter-layer insulating film 921, followed by etching back, allowing the polycrystal silicon film 150 to be exposed. (FIG. 56)

Figure 57:
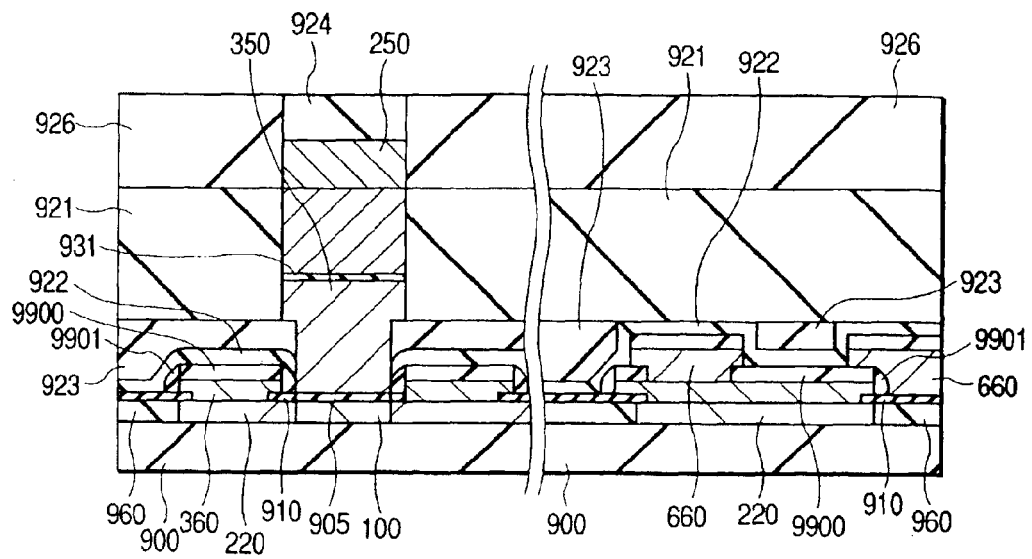
FIG. 57 is a plane layout diagram explaining a plane layout of the multi-stage inverter gate.

A write data line 250 is formed on the polycrystal silicon film 150. Further, an inter-layer insulating film 926 is formed to cover the write data line 250, allowing the surface of the stacked structure to be planarized. (FIG. 57)

Figure 58:
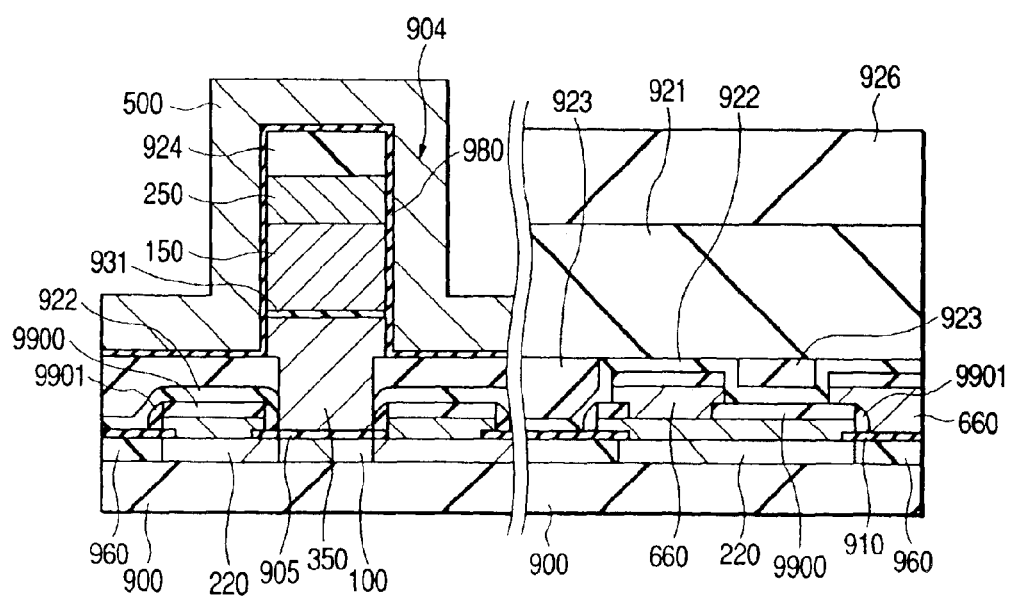
FIG. 58 is a plane layout diagram explaining a plane layout of the multi-stage inverter gate.

A trench 904 is formed in the inter-layer insulating film 926 and 921 in accordance with a gate pattern. A gate insulating film 980 is formed on at least a side wall of the exposed semiconductor layer 150 and a write word line 500 is formed to cover the gate insulating film 980. In this structure, the gate electrode and the write word line are formed by the same layer. (FIG. 58)

By the above methods it is possible to form a semiconductor memory device having a superior write and storage performance.

When an insulating film was inserted in a Schottky junction in a field effect transistor to control the tunneling effect, the leakage current of source and drain electrodes could be suppressed extremely low. By the application of this low leakage characteristic it is possible to form a semiconductor device having an excellent information holding characteristic.

Main reference numerals will be mentioned below for making the drawings easier to understand.

100, 110: silicon substrate, 150: polycrystal silicon layer, 320: heavily doped diffusion layer electrode, 500, 510: gate electrode, 250, 350: electrode, 600, 625, 660: metal wiring, 710, 720, 730: contact, 900, 901, 905, 910, 920, 921, 922, 923, 924, 925, 926, 931, 932, 955, 956, 960, 980: insulating film.

According to the present invention, as set forth above, it is possible to provide a field effect transistor with extremely low leakage current.

In another mode of the present invention it is possible to provide a semiconductor device having an excellent information holding characteristic.

According to the manufacturing method of the present invention it is possible to provide a novel field effect transistor or semiconductor device with extremely low leakage current.

What is claimed is:

1. A semiconductor device comprising:
 a semiconductor region as a channel path for a carrier;
 a metal region arranged to one side of said semiconductor region;
 an insulating film which is thin to enable said carrier to tunnel form said metal region to said semiconductor region, said insulating film is interposed between said semiconductor region and said metal region;
 a conductive region arranged to another side of said semiconductor region, contacting to said semiconductor region;
 a gate insulating film arranged on a side surface of said semiconductor region elongating over said metal region, semiconductor region and conductive region; and
 a gate electrode arranged on said gate insulating film,
 wherein said gate electrode is perpendicular to a surface of said insulating film.

2. A semiconductor device according to claim 1, wherein said metal region is selected from one comprised of titanium, titanium suicide, tungsten, tungsten silicide, cobalt, cobalt suicide, platinum, platinum suicide, nickel or nickel silicide.

3. A semiconductor device according to claim 1, wherein said insulating film is selected from one comprised of silicon oxide, silicon nitride, metal oxide, metal nitride, refractory metal oxide or refractory metal nitride.

4. A semiconductor device according to claim 1, wherein said insulating film thickness is not larger than 3 nm.

5. A semiconductor device according to claim 1, wherein a barrier height between said metal region and said insulating film is larger than a barrier height between said metal region and said semiconductor region.

6. A semiconductor device comprising:
 a semiconductor substrate;
 a source and drain region formed in said semiconductor substrate;
 a first gate insulating film formed between said source and drain region on said semiconductor substrate;
 a metal region arranged on said first gate insulating film functioning as a first gate electrode for said source and drain region;
 a semiconductor region as a channel path for a carrier arranged over said metal region;
 an insulating film which is thin to enable said carrier to tunnel form said metal region to said semiconductor region, said insulating film is interposed between said semiconductor region and said metal region;
 a conductive region arranged on said semiconductor region, contacting to said semiconductor region;
 a second gate insulating film arranged on a side surface of said semiconductor region elongating over said metal region, semiconductor region and conductive region; and
 a second gate electrode arranged on said gate insulating film,
 wherein said second gate electrode is perpendicular to a surface of said insulating film.

7. A semiconductor device according to claim 6, wherein said metal region is selected from one comprised of titanium, titanium suicide, tungsten, tungsten silicide, cobalt, cobalt silicide, platinum, platinum silicide, nickel or nickel silicide.

8. A semiconductor device according to claim 6, wherein said insulating film is selected from one comprised of silicon oxide, silicon nitride, metal oxide, metal nitride, refractory metal oxide or refractory metal nitride.

9. A semiconductor device according to claim 6, wherein said insulating film thickness is not larger than 3 nm.

10. A semiconductor device according to claim 6, wherein a barrier height between said metal region and said insulating film is larger than a barrier height between said metal region and said semiconductor region.

11. A semiconductor device comprising:
 a metal region functioned as source or drain;
 a semiconductor region located to contact to said metal region with a thin insulating film intervened between said metal region and said semiconductor region, wherein said semiconductor region functions as a channel path for a carrier and said thin insulating film is thin enough to enable said carrier to tunnel form said metal region to said semiconductor region;
 a conductive region functioned as a source or drain which is located to contact to said semiconductor region;

a gate insulating film located in a same direction of said channel path, along a side surface of said metal region, said semiconductor region and said conductive region; and a gate electrode located to cover said gate insulating film, wherein said gate electrode at least located over said conductive region, said channel region and said metal region.

12. A semiconductor device according to claim 11, wherein said metal region is selected from one comprised of titanium, titanium silicide, tungsten, tungsten silicide, cobalt, cobalt silicide, platinum, platinum silicide, nickel or nickel silicide.

13. A semiconductor device according to claim 11, wherein said insulating film is selected from one comprised of silicon oxide, silicon nitride, metal oxide, metal nitride, refractory metal oxide or refractory metal nitride.

14. A semiconductor device according to claim 11, wherein said insulating film thickness is not larger than 3 nm.

15. A semiconductor device according to claim 11, wherein a barrier height between said metal region and said insulating film is larger than a barrier height between said metal region and said semiconductor region.

* * * * *